(12) United States Patent
Ryu et al.

(10) Patent No.: US 12,399,527 B2
(45) Date of Patent: Aug. 26, 2025

(54) DISPLAY DEVICE AND MANUFACTURING METHOD THEREOF

(71) Applicant: Samsung Display Co., Ltd., Yongin-si (KR)

(72) Inventors: Suchang Ryu, Yongin-si (KR); Sunjoong Gwak, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 559 days.

(21) Appl. No.: 17/697,835

(22) Filed: Mar. 17, 2022

(65) Prior Publication Data

US 2022/0310980 A1 Sep. 29, 2022

(30) Foreign Application Priority Data

Mar. 23, 2021 (KR) .................. 10-2021-0037484

(51) Int. Cl.
| | |
|---|---|
| *H10K 50/86* | (2023.01) |
| *G06F 1/16* | (2006.01) |
| *H10K 50/84* | (2023.01) |
| *H10K 59/80* | (2023.01) |
| *H10K 71/00* | (2023.01) |
| *H10K 102/00* | (2023.01) |

(52) U.S. Cl.
CPC .......... *G06F 1/1618* (2013.01); *G06F 1/1616* (2013.01); *H10K 50/84* (2023.02); *H10K 50/865* (2023.02); *H10K 59/87* (2023.02); *H10K 71/00* (2023.02); *H10K 59/8792* (2023.02); *H10K 2102/311* (2023.02)

(58) Field of Classification Search
CPC ...... H10K 50/865; H10K 50/84; H10K 71/00; H10K 2102/311; H10K 59/87; H10K 59/5792; G06F 1/1616; G06F 1/1618
See application file for complete search history.

(56) References Cited

U.S. PATENT DOCUMENTS

| | | | |
|---|---|---|---|
| 6,541,730 B2 | 4/2003 | Nam et al. | |
| 10,461,274 B2 | 10/2019 | Kim | |
| 10,777,756 B2 | 9/2020 | Lee et al. | |
| 2006/0197904 A1 | 9/2006 | Kinoshita et al. | |
| 2020/0333845 A1 * | 10/2020 | Yug ..................... | H04M 1/0216 |

FOREIGN PATENT DOCUMENTS

| | | | |
|---|---|---|---|
| KR | 10-2004-0074947 A | | 8/2004 |
| KR | 10-0673073 B1 | | 1/2007 |
| KR | 10-2012-0119082 A | | 10/2012 |
| KR | 10-2018-0053483 A | | 5/2018 |
| KR | 10-2019-0044318 | * | 4/2019 |
| KR | 10-2019-0069062 A | | 6/2019 |
| KR | 10-2020-0121948 A | | 10/2020 |

* cited by examiner

*Primary Examiner* — Timor Karimy
(74) *Attorney, Agent, or Firm* — Womble Bond Dickinson (US) LLP

(57) ABSTRACT

A display device includes: a display panel comprising a folding region configured to be folded around a folding axis and a non-folding region adjacent to the folding region; and a window on the display panel and configured to be folded with the display panel, wherein: a side surface of the display panel has a first surface roughness in the folding region and a second surface roughness in the non-folding region; the first surface roughness is lower than the second surface roughness; and a side surface of the window has the same surface roughness in the non-folding region and the folding region.

13 Claims, 21 Drawing Sheets

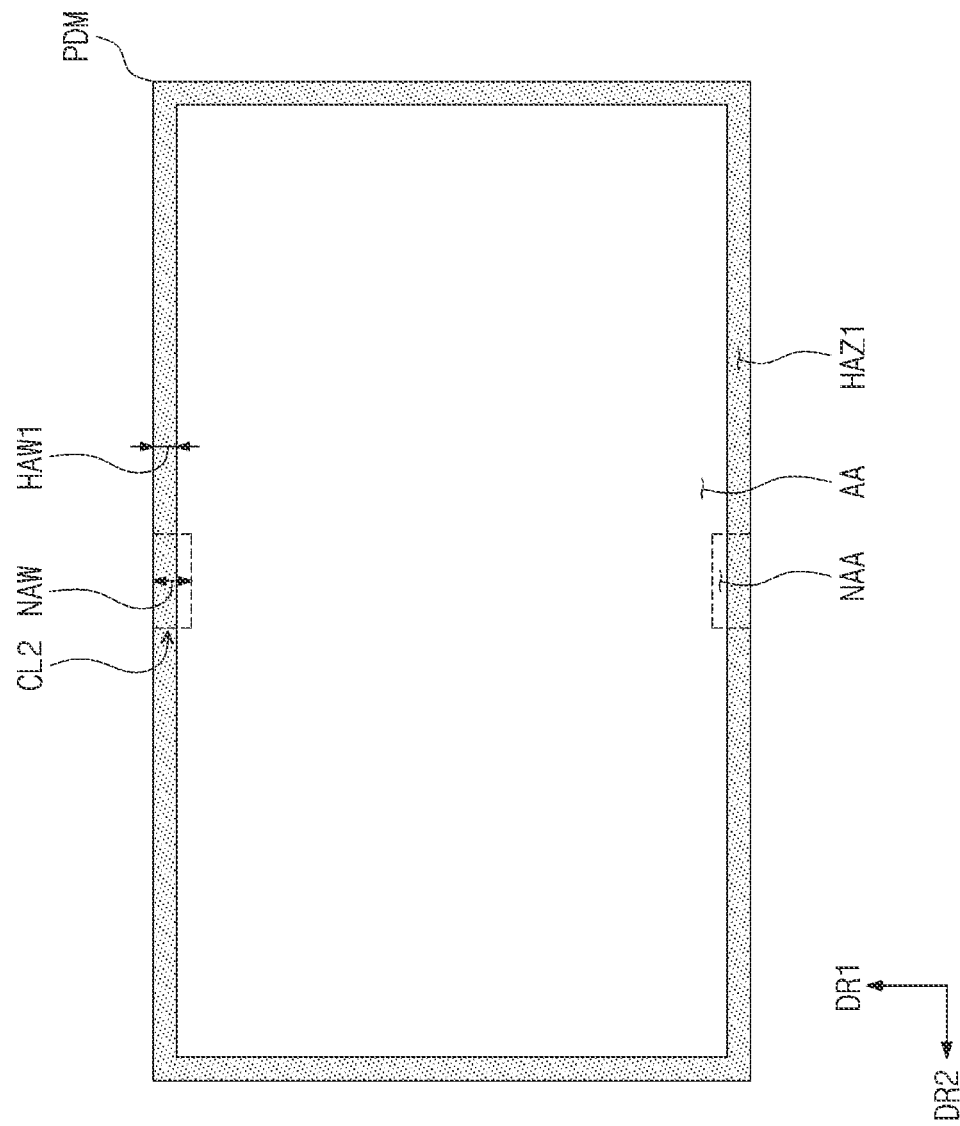

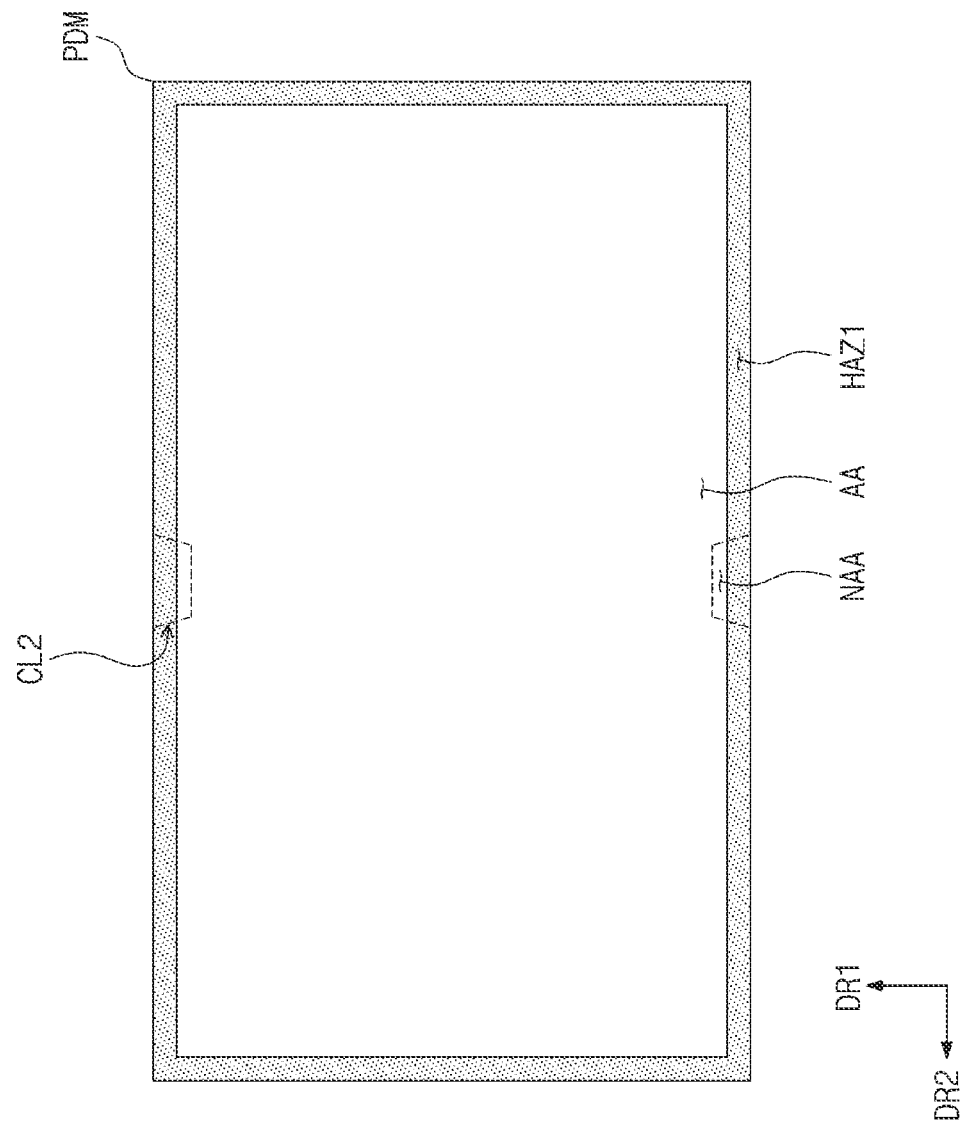

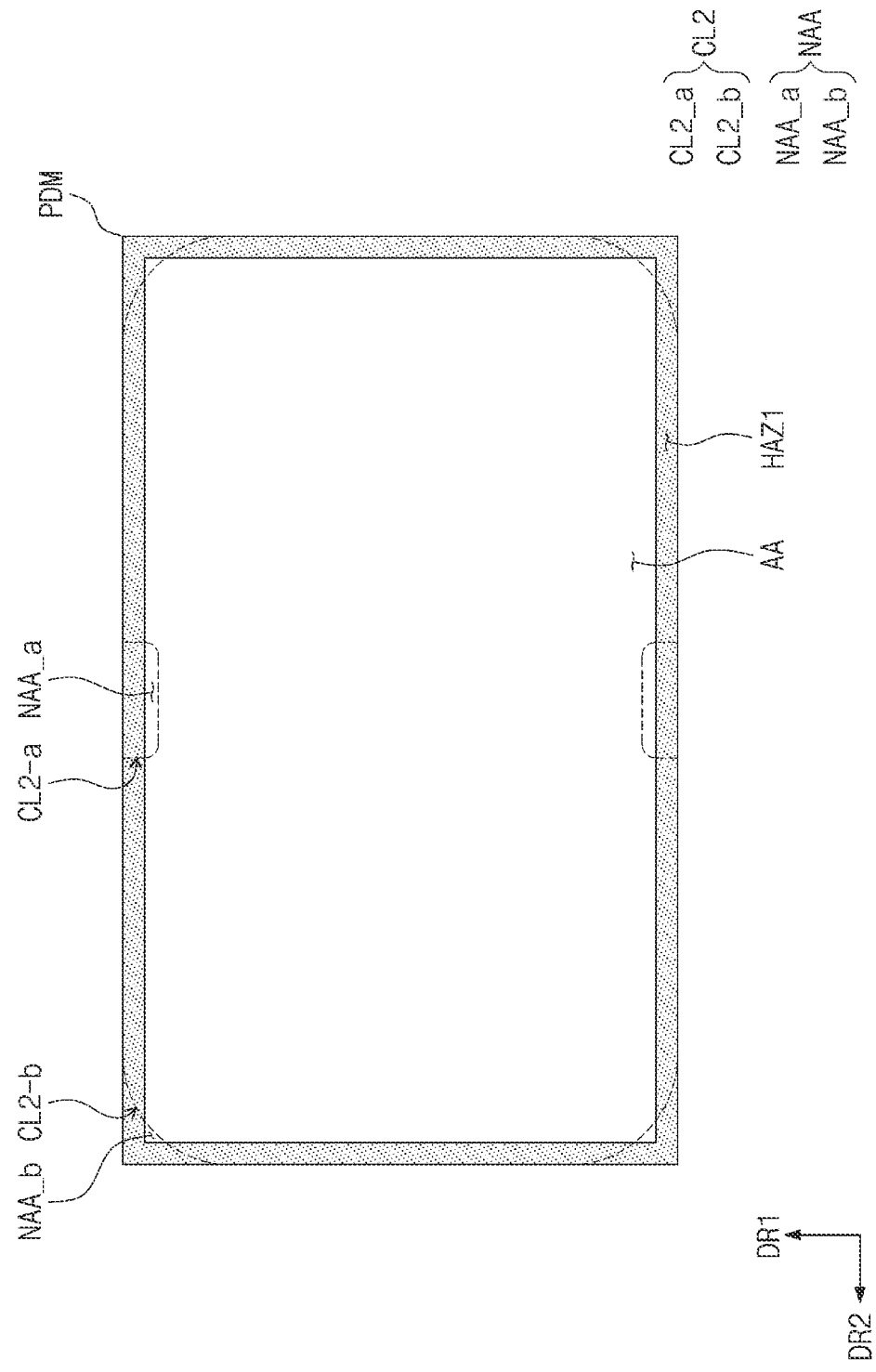

DISPLAY DEVICE AND MANUFACTURING METHOD THEREOF

CROSS-REFERENCE TO RELATED APPLICATION

The present application claims priority to and the benefit of Korean Patent Application No. 10-2021-0037484, filed on Mar. 23, 2021, in the Korean Intellectual Property Office, the entire contents of which is hereby incorporated by reference.

BACKGROUND

1. Field

Aspects of some embodiments of the present disclosure herein relate to a display device and a method of manufacturing the same.

2. Description of Related Art

Electronic devices such as smart phones, tablets, notebook computers, and smart televisions are being developed. Such electronic devices generally have a display device to graphically display information. The electronic devices generally further include various electronic modules in addition to the display device.

A display device may have a flexible display member capable of being folded or rolled. Unlike flat panel display devices, flexible display devices can be folded, rolled, or bent (e.g., similar to paper). A flexible display device having a shape that can be changed in various ways may be easier for users to carry and can improve user convenience.

The above information disclosed in this Background section is only for enhancement of understanding of the background and therefore the information discussed in this Background section does not necessarily constitute prior art.

SUMMARY

Aspects of some embodiments of the present disclosure herein relate to a display device and a method of manufacturing the same, and for example, to a display device which can be folded around a folding axis, and a method of manufacturing the display device.

Aspects of some embodiments of the present disclosure include a display device with relatively improved folding reliability and a method of manufacturing the display device.

Aspects of some embodiments of the inventive concept include a display device including: a display panel including a folding region foldable around a folding axis and a non-folding region adjacent to the folding region; and a window on the display panel and foldable along the display panel. A side surface of the display panel has a first surface roughness in the folding region and a second surface roughness in the non-folding region. The first surface roughness is lower than the second surface roughness. A side surface of the window has the same surface roughness in the non-folding region and the folding region.

According to some embodiments, the window may include a thin-film glass.

According to some embodiments, the display device may further include an anti-reflection layer on the display panel and foldable along the display panel.

According to some embodiments, a side surface of the anti-reflection layer has a third surface roughness in the folding region and a fourth surface roughness in the non-folding region. The third surface roughness may be lower than the fourth surface roughness.

According to some embodiments, the display panel includes a recessed portion in the folding region. When the direction of the folding axis is referred to as a reference direction, the display panel has, in the reference direction, a first width in the non-folding region and a second width in the folding region. The second width may be smaller than the first width.

According to some embodiments, the recessed portion may include a curved shape.

According to some embodiments, the window has the same width in the folding region and the non-folding region in the reference direction.

According to some embodiments, the window includes a transmission region through which light passes and a bezel region adjacent to the transmission region, and the recessed portion is spaced apart from the transmission region.

According to some embodiments of the inventive concept, a display device includes a display panel including a folding region foldable around a folding axis and a non-folding region adjacent to the folding region, and a window on the display panel and foldable along the display panel. A side surface of the display panel includes a first side surface having a first surface roughness and a second side surface having a second surface roughness higher than the first surface roughness. A side surface of the window has the same surface roughness in the non-folding region and the folding region. The first side surface includes a side surface overlapping at least in the folding region among the side surfaces of the display panel.

According to some embodiments, the window may include a thin-film glass.

According to some embodiments, the first side surface may include a curved shape.

According to some embodiments, the first side surface may include a side surface overlapping the folding region among the side surfaces of the display panel.

According to some embodiments, the first side surface may further include a side surface overlapping a portion of the non-folding region among the side surfaces of the display panel.

According to some embodiments of the inventive concept, a display device may further include an anti-reflection layer on the display panel and foldable along the display panel. A side surface of the anti-reflection layer comprises a third side surface having a third surface roughness and a fourth side surface having a fourth surface roughness higher than the third surface roughness. The third side surface overlaps the first side surface.

According to some embodiments of the inventive concept, a method for manufacturing a display device includes: manufacturing a display module including a folding region that is foldable around a folding axis and a non-folding region adjacent to the folding region; and arranging, on the display module, a window that is foldable along the display module. The manufacturing of the display module includes obtaining a preliminary display module including an effective region and a non-effective region from a mother substrate by performing a first cutting process along a first cutting line. The manufacturing of the display module further includes removing the non-effective region from the effective region by performing a second cutting process along a second cutting line located at a boundary between the non-effective region and the effective region. The non-effective region includes at least a region extending from the folding region.

According to some embodiments, the window may include a thin-film glass.

According to some embodiments, the first cutting process may use a first laser having a first wavelength, and the second cutting process may use a second laser having a second wavelength different from the first wavelength.

According to some embodiments, the first cutting process includes a process of irradiating the first laser n times repeatedly, and the second cutting process includes a process of irradiating the second laser m times repeatedly. m may be a natural number greater than n.

According to some embodiments, the first laser is irradiated at a first frequency in the first cutting process, the second laser is irradiated at a second frequency in the second cutting process, and the second frequency may be greater than the first frequency.

According to some embodiments, the manufacturing of the display module may further include arranging an anti-reflection layer on the preliminary display module.

According to some embodiments, the display panel includes a recessed portion formed through the second cutting process, and the window includes a transmission region through which light passes and a bezel region adjacent to the transmission region. The recessed portion is spaced apart from the transmission region.

According to some embodiments, the recessed portion may include a curved shape.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
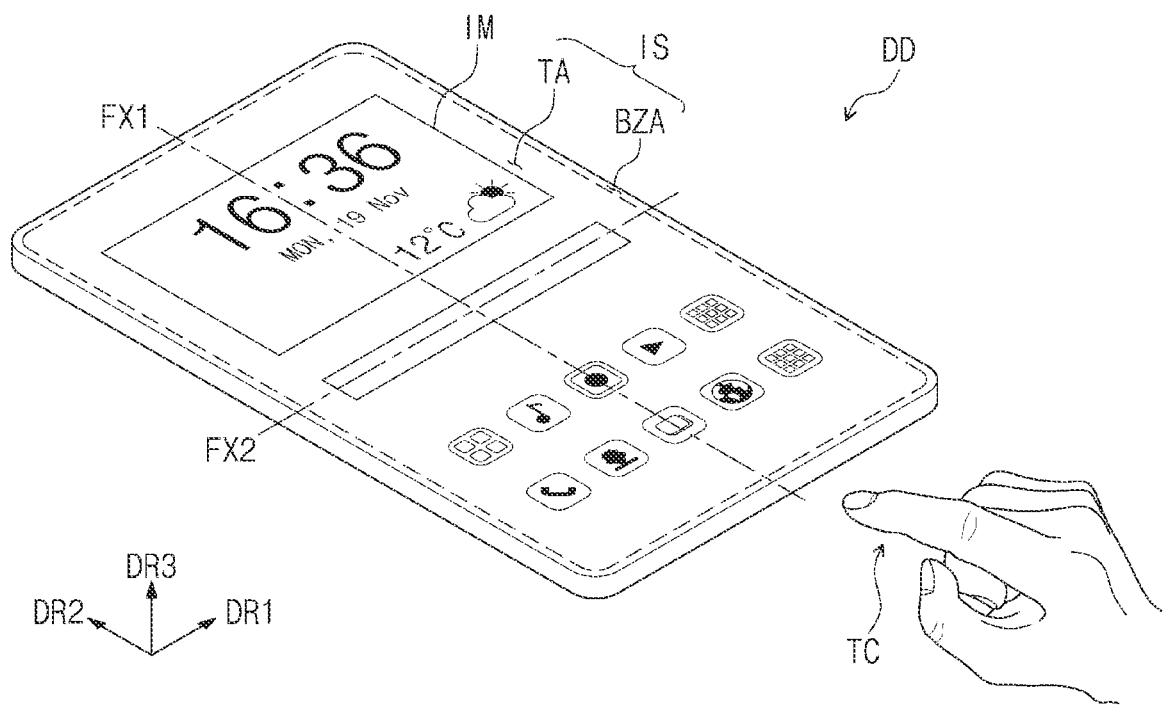
FIG. 1 is a perspective view of a display device according to some embodiments of the inventive concept.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents.

As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the present invention. Similarly, the second element may also be referred to as the first element. The terms of a singular form include plural forms unless otherwise specified.

Terms, such as "below", "lower", "above", "upper" and the like, are used herein for ease of description to describe one element's relation to other element(s) as illustrated in the figures. The above terms are relative concepts and are described based on the directions indicated in the drawings.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the inventive concept will be described in more detail with reference to the accompanying drawings.

FIG. 1 is a perspective view of a display device according to some embodiments of the inventive concept.

Referring to FIG. 1, the display device DD has a rectangular shape having a short side in a first direction DR1 and a long side in a second direction DR2 crossing the first direction DR1. However, the shape of the display device DD is not limited thereto, and the display device DD may have any suitable shape according to the design of the display device DD (e.g., circular, oval, square, rectangular, irregular, etc.).

The display device DD may be a foldable electronic device. For example, the display device DD according to some embodiments of the inventive concept may be folded along folding axes FX1 and FX2 extending in a direction (e.g., a set or predetermined direction). Hereinafter, a state of being folded along the folding axes FX1 and FX2 is defined as a folded state, and a state of being unfolded is defined as an unfolded state.

The folding axes FX1 and FX2 may extend in the first direction DR1 or the second direction DR2. According to some embodiments of the inventive concept, a folding axis extending in the second direction DR2 is defined as a first folding axis FX1, and a folding axis extending in the first direction DR1 is defined as a second folding axis FX2. The display device DD may include one of the first and second folding axes FX1 and FX2. That is, the display device DD may be folded along one of the first and second folding axes FX1 and FX2.

The display device DD according to some embodiments the inventive concept may be not only a large display device such as a television or a monitor, but also a small and medium-sized display device such as a mobile phone, a tablet, a car navigation system, or a game machine. These are only presented as examples, and the display device DD according to the inventive concept may be applied to any suitable electronic devices without departing from the spirit and scope of embodiments according to the present invention.

As illustrated in FIG. 1, the display device DD may display an image IM toward a third direction DR3 on a display surface IS parallel to each of the first direction DR1 and the second direction DR2. The display surface IS on which an image IM is displayed may correspond to the front surface of the display device DD.

The display surface IS of the display device DD may be divided into a plurality of regions. The display surface IS of the display device DD may be divided into a transmission region TA and a bezel region BZA. The transmission region TA may be a region in which an image IM is displayed. A user visually recognizes an image IM through the transmission region TA. According to some embodiments, the transmission region TA is illustrated in a tetragonal shape having rounded vertices. However, this is illustrated as an example, and the transmission region TA may have various shapes and is not limited to any one embodiment.

The bezel region BZA is adjacent to the transmission region TA. The bezel region BZA may have a color (e.g., a set or predetermined color). The bezel region BZA may surround the transmission region TA. Accordingly, the shape of the transmission region TA may be substantially defined by the bezel region BZA. However, this is illustrated as an example, and the bezel region BZA may be arranged adjacent to only one side of the transmission region TA, or may be omitted. The display device DD according to some embodiments of the inventive concept may include various embodiments and is not limited to any one embodiment.

The display device DD according to the inventive concept may sense a user's input TC (e.g., a touch input) applied from the outside. The user's input TC includes various types of external inputs such as a part of the user's body, light, heat, or pressure. According to some embodiments, the user's input TC is illustrated as the user's hand applied to the front side. However, this is illustrated as an example, and as described above, the user's input TC may be provided in various forms. In addition, the display device DD may sense the user's input TC applied to the side surface or the rear surface of the display device DD according to the structure of the display device DD, and embodiments according to the present invention are not limited to any one embodiment.

The display device DD may display an image IM by activating the display surface IS and sense a user's input TC at the same time. According to some embodiments, the region for sensing the user's input TC is illustrated as being provided in the transmission region TA in which the image IM is displayed. However, this is illustrated as an example, and the region for sensing the user's input TC may be provided in the bezel region BZA or in all regions of the display surface IS.

Figure 2A:
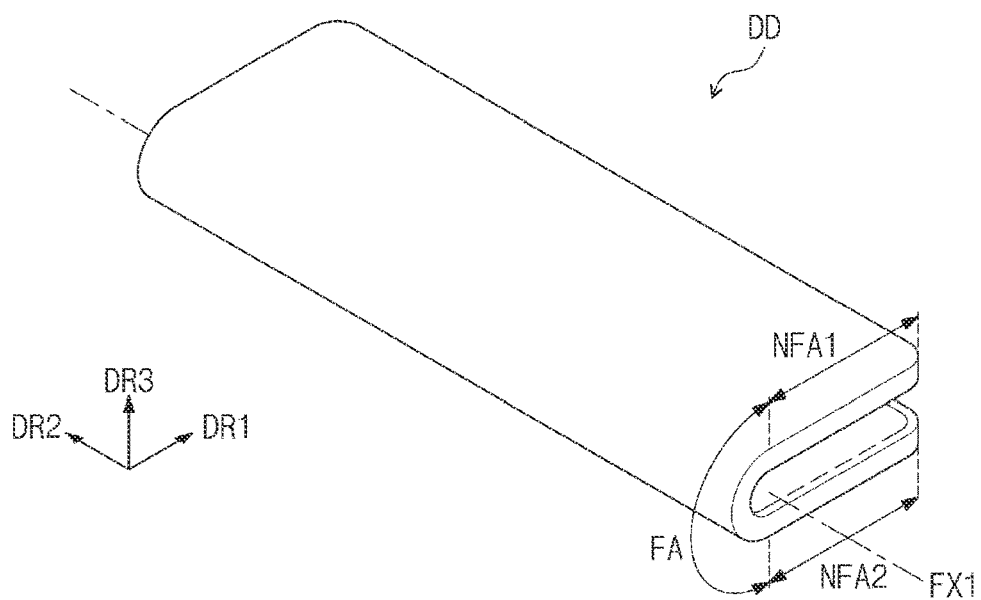
FIG. 2A illustrates a state in which the display device illustrated in FIG. 1 is in-folded along a first folding axis.
Figure 2B:
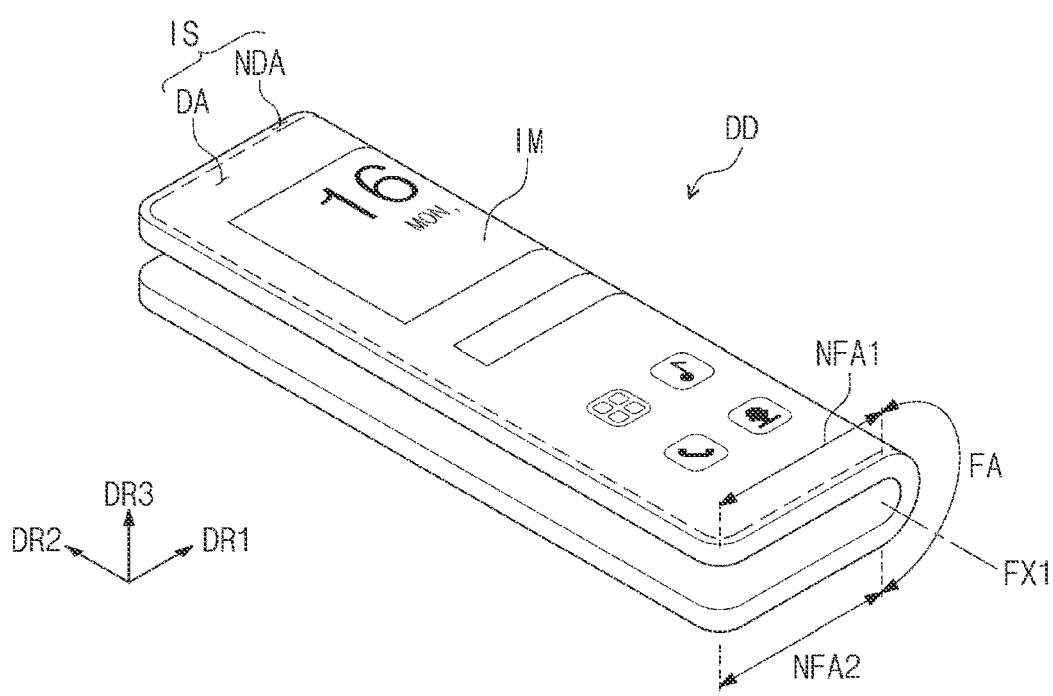
FIG. 2B illustrates a state in which the display device illustrated in FIG. 1 is out-folded along the first folding axis.

FIG. 2A illustrates a state in which the display device illustrated in FIG. 1 is in-folded along the first folding axis, and FIG. 2B illustrates a state in which the display device illustrated in FIG. 1 is out-folded along the first folding axis.

Referring to FIGS. 1 and 2A, the display device DD may have a plurality of regions defined therein, according to types of operation. The plurality of regions may be divided into a folding region FA and at least one of non-folding regions NFA1 and NFA2. According to some embodiments of the inventive concept, the display device DD includes two non-folding regions NFA1 and NFA2 and one folding region FA defined between the two non-folding regions NFA1 and NFA2.

According to some embodiments of the inventive concept, the non-folding regions NFA1 and NFA2 may include a first non-folding region NFA1 and a second non-folding region NFA2. The first non-folding region NFA1 is adjacent to one side of the folding region FA in the first direction DR1, and the second non-folding region NFA2 is adjacent to the other side of the folding region FA in the first direction DR1. The folding region FA is a region that is foldable along the first folding axis FX1 and substantially forms a curvature. Here, the first folding axis FX1 may extend in the second direction DR2, that is, in a direction parallel to the long axis direction of the display device DD.

The display device DD may be in-folded or out-folded. Here, being in-folded refers to being folded so that the display surfaces IS face each other, and being out-folded refers to being folded so that the rear surfaces of the display device DD face each other.

The display device DD illustrated in FIG. 2A may be in-folded so that the display surface IS of the first non-folding region NFA1 and the display surface IS of the second non-folding region NFA2 face each other.

Referring to FIG. 2B, the display device DD may be out-folded along the first folding axis FX1. When the display device DD is out-folded, the display surface IS may be exposed to the outside.

The display device DD may be folded in in-folded and out-folded states, but according to some embodiments of the inventive concept, the display device DD may be folded only in one state among the in-folded state and the out-folded state.

Figure 3A:
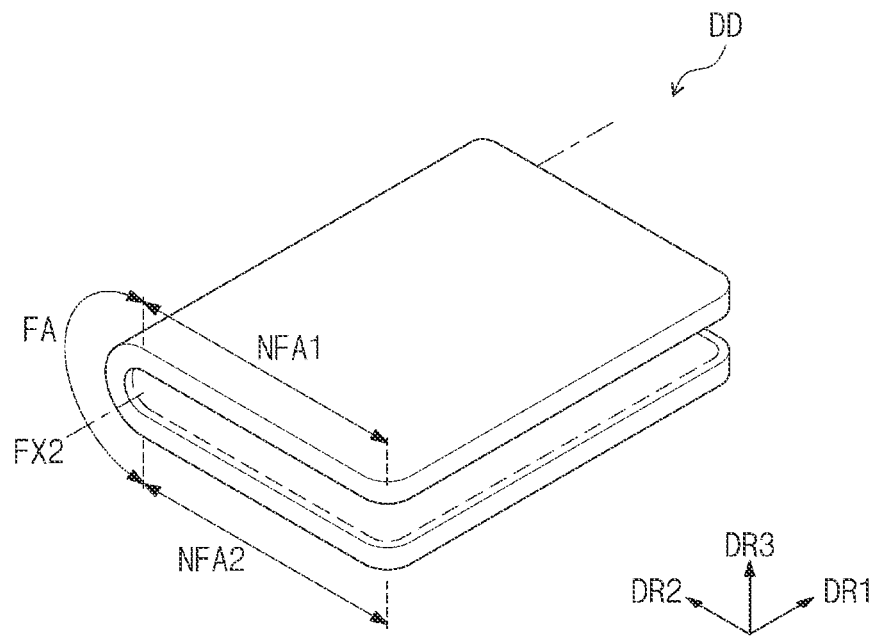
FIG. 3A illustrates a state in which the display device illustrated in FIG. 1 is in-folded along a second folding axis.
Figure 3B:
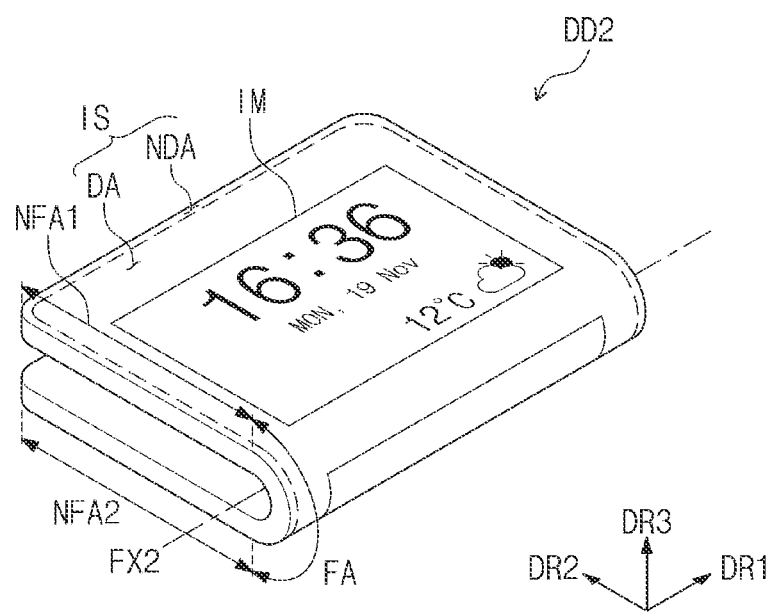
FIG. 3B illustrates a state in which the display device illustrated in FIG. 1 is out-folded along a second folding axis.

FIG. 3A illustrates a state in which the display device illustrated in FIG. 1 is in-folded along a second folding axis. FIG. 3B illustrates a state in which the display device illustrated in FIG. 1 is out-folded along a second folding axis.

According to some embodiments of the inventive concept, the first non-folding region NFA1 may be adjacent to one side of the folding region FA in the second direction DR2, and the second non-folding region NFA2 may be adjacent to the other side of the folding region FA in the second direction DR2. The folding region FA is a region that is foldable along the second folding axis FX2 and substantially forms a curvature. Here, the second folding axis FX2 may extend in the first direction DR1, that is, in a direction parallel to the short axis direction of the display device DD.

The display device DD may be in-folded or out-folded along the second folding axis FX2.

Because the display device DD includes the first and second folding axes FX1 and FX2, the display device DD may be folded in the short axis direction and the long axis direction. However, as an example for the purposes of illustration of embodiments of the inventive concept, the display device DD may have only one of the first and second folding axes FX1 and FX2.

According to some embodiments, the display device DD has one folding region FA defined therein, but embodiments according to the inventive concept are not limited thereto. According to some embodiments of the inventive concept, the display device DD may have a plurality of folding regions defined therein.

Figure 4A:
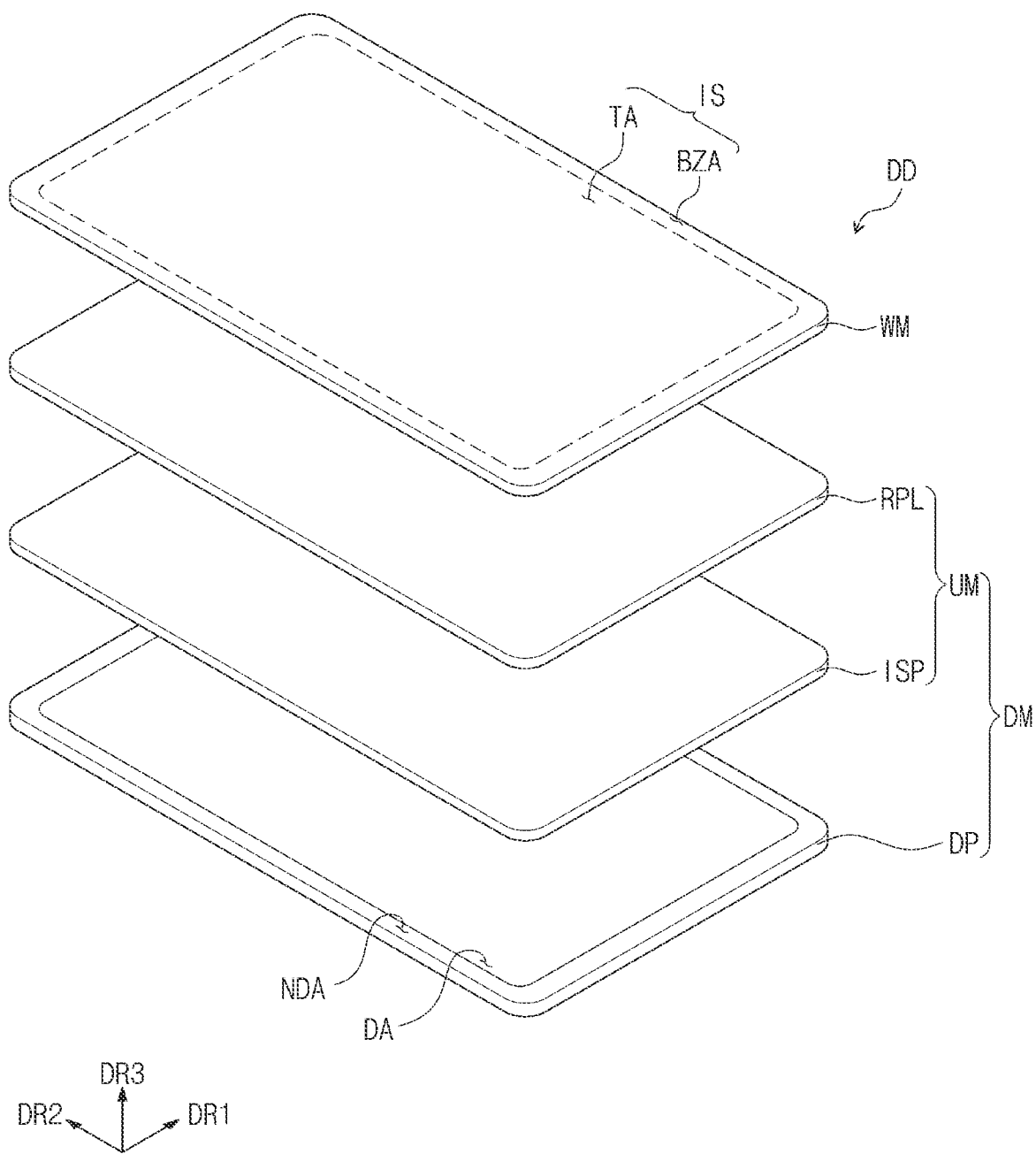
FIGS. 4A and 4B are exploded perspective views of a display device according to some embodiments of the inventive concept.
Figure 4B:
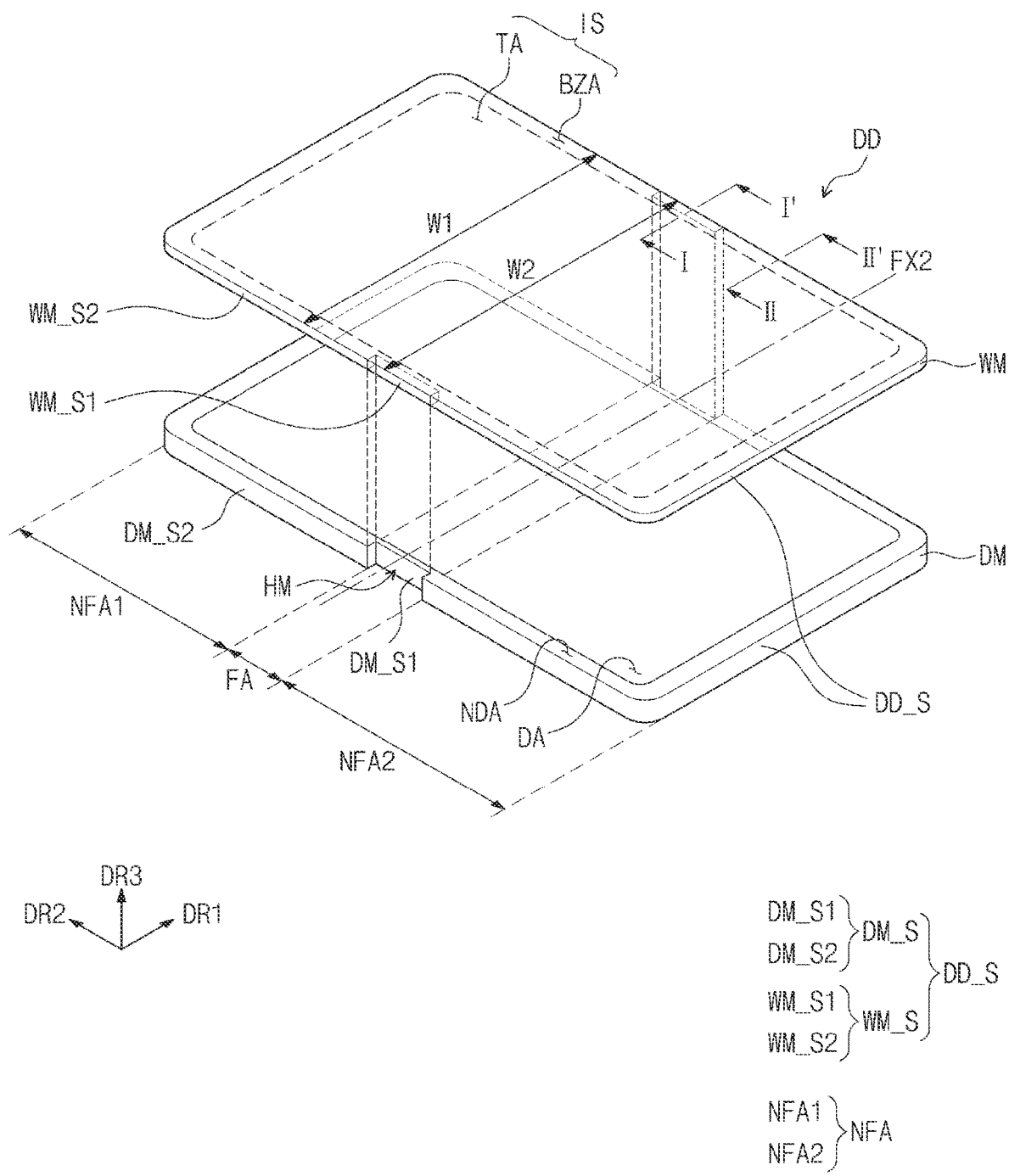

FIGS. 4A and 4B are exploded perspective views of a display device according to some embodiments of the inventive concept.

Referring to FIG. 4A, the display device DD according to some embodiments of the inventive concept may include a display module DM and a window WM arranged on the display module DM. The display module DM may include a display panel DP and an upper module UM.

The display panel DP according to some embodiments of the inventive concept may be a light-emitting display panel and is not particularly limited thereto. For example, the display panel DP may be an organic light-emitting display panel, an inorganic light-emitting display panel, or a quantum dot light-emitting display panel. The light-emitting element of the organic light-emitting display panel may contain an organic light-emitting material, and the light-emitting element of the inorganic light-emitting display panel may contain an inorganic light-emitting material. The light-emitting element of the quantum dot light-emitting display panel may contain a quantum dot, a quantum rod, and the like. Hereinafter, the display panel DP will be described as an organic light-emitting display panel. The display panel DP may output an image IM, and the output image may be displayed through the display surface IS.

The display panel DP may be a flexible display panel. Accordingly, the display panel DP may be folded or unfolded around the first folding axis FX1 or the second folding axis FX2.

The display panel DP includes a display region DA in which an image is displayed and a non-display region NDA adjacent to the display region DA. According to some embodiments of the inventive concept, the non-display region NDA may surround the display region DA. However, this is illustrated as an example, and the non-display region NDA may be defined in various shapes and is not limited to any one embodiment. According to some embodiments of the inventive concept, the display region DA of the display panel DP may correspond to at least a portion of the transmission region TA.

The upper module UM may include various members. According to some embodiments of the inventive concept, the upper module UM may include an anti-reflection layer RPL and an input sensor layer ISP.

The anti-reflection layer RPL may be arranged on the display panel DP. The anti-reflection layer RPL may be bent or folded around the first folding axis FX1 (see FIG. 1) or the second folding axis FX2 (see FIG. 2) along with the display panel DP.

The anti-reflection layer RPL may prevent or reduce instances of elements constituting or forming the display panel DP may be visually recognized or perceived from the outside by external light incident through the front surface of the display device DD. The anti-reflection layer RPL may include a polarizing film and/or a phase retardation film. The number of the phase retardation film and the phase retardation length ($\lambda/4$ or $\lambda/2$) of the phase retardation film may be determined according to the principle of operation of the anti-reflection layer RPL. However, embodiments according to the present invention are not limited thereto, and the anti-reflection layer RPL may include a plurality of color filters and light-blocking patterns arranged between the color filters.

According to some embodiments of the inventive concept, the display module DM may further include an input sensor layer ISP. The input sensor layer ISP may sense an external input by a capacitive method, a pressure sensing method, or an electromagnetic induction method. The input sensor layer ISP may be formed on the display panel DP by a continuous process. In addition, the input sensor layer ISP and the display panel DP may be bonded to each other by an adhesive film. In this case, the input sensor layer ISP may not be manufactured together with the display panel DP by a continuous process, but may be manufactured by a process separate from a process for the display panel DP and then bonded to the upper surface of the display panel DP by an adhesive film.

The window WM may be made of a transparent material through which an image (see FIG. 1) may pass. For example, the window WM may be made of glass, sapphire, plastic, or the like. The window WM is illustrated as a single layer, but embodiments according to the present disclosure are not limited thereto and may include a plurality of layers.

The upper surface of the window WM defines the display surface IS of the display device DD. The window WM may be optically transparent. Accordingly, an image generated by the display panel DP may be easily recognized by a user through the window WM.

Meanwhile, the bezel region BZA of the display device DD described above may be substantially provided as a region in which a material containing a color (e.g., a set or predetermined color) is printed on one region of the window WM. According to some embodiments of the inventive concept, the window WM may include a light-blocking pattern for defining the bezel region BZA. The light-blocking pattern is a colored organic film and may be formed by, for example, a coating method.

The window WM may be made of a soft material. Accordingly, the window WM may be folded or unfolded around the first folding axis FX1 or the second folding axis FX2. That is, when the shape of the display module DM is changed, the shape of the window WM may be changed together with the display module DM.

According to some embodiments of the inventive concept, the window WM may include a flexible glass or a synthetic resin film. For example, when the window WM includes a flexible glass, the thickness of the glass may be about 80 µm or less. Therefore, the flexible glass may be referred to as a thin-film glass. For example, the thickness of the window WM may be about 30 µm, but the thickness of the window WM is not limited thereto. When the window WM includes a synthetic resin film, the window WM may include a polyimide (PI) film or a polyethylene terephthalate (PET) film. When the window WM is a synthetic resin film, the thickness of the window WM may be about 50 µm. The window WM may have a multi-layered structure or a single-layered structure. Hereinafter, the window WM is described as a thin-film glass.

The window WM may be coupled to the display module DM by an adhesive film. According to some embodiments of the inventive concept, the adhesive film may include an optically clear adhesive film (OCA). However, the adhesive film is not limited thereto and may include a conventional adhesive or glue agent. For example, the adhesive film may include an optically clear resin (OCR) or a pressure sensitive adhesive film (PSA).

Referring to FIG. 4B, the display module DM may include a recessed portion HM. According to some embodiments of the inventive concept, the recessed portion HM may be included in the folding region FA. Hereinafter, for the convenience of description, only the folding region FA that is foldable along the second folding axis FX2 is illustrated. However, embodiments according to the present invention are not limited thereto and may apply to a display device including a folding region that is foldable along the first folding axis FX1 (see FIG. 1).

According to some embodiments of the inventive concept, the recessed portion HM may be included in the non-display region NDA. The recessed portion HM doesn't overlap the display region DA in which an image is displayed.

According to some embodiments of the inventive concept, the recessed portion HM is spaced apart from the transmission region TA of the window WM. The recessed portion HM doesn't overlap the transmission region TA and overlaps the bezel region BZA. The recessed portion HM may not be visually recognized by a user due to the light-blocking pattern included in the bezel region BZA.

The shape and formation step of the recessed portion HM will be described later with reference to FIGS. 9A to 12B.

When a direction parallel to the second folding axis FX2 (see FIG. 1) is referred to as a reference direction, the window WM has, in the reference direction, a first width W1 in the non-folding region NFA and a second width W2 in the folding region FA. According to some embodiments of the inventive concept, the first width W1 and the second width W2 may be the same as each other. However, embodiments according to the present invention are not limited thereto, and the second width W2 may be smaller than the first width W1.

Side surfaces DD_S of the display device DD includes a side surface DM_S of the display module DM and a side surface WM_S of the window WM.

According to some embodiments of the inventive concept, the side surface DM_S of the display module DM includes a first module side surface DM_S1 and a second module side surface DM_S2.

According to some embodiments of the inventive concept, the first module side surface DM_S1 may be a side surface overlapping the folding region FA among the side surfaces DM_S of the display module DM. The second module side surface DM_S2 may be a side surface overlapping the first and second non-folding regions NFA1 and NFA2 among the side surfaces DM_S of the display module DM. However, embodiments according to the present invention are not limited thereto, and the first module side surface DM_S1 may include at least a portion overlapping the folding region FA. According to some embodiments of the inventive concept, the first module side surface DM_S1 may further include a portion overlapping some of the first and second non-folding regions NFA1 and NFA2 among the side surfaces DM_S of the display module DM.

The side surface WM_S of the window WM includes a first window side surface WM_S1 and a second window side surface WM_S2. The first window side surface WM_S1 may be a side surface overlapping the folding region FA, and the second window side surface WM_S2 may be a side surface overlapping the non-folding region NFA.

Figure 5A:
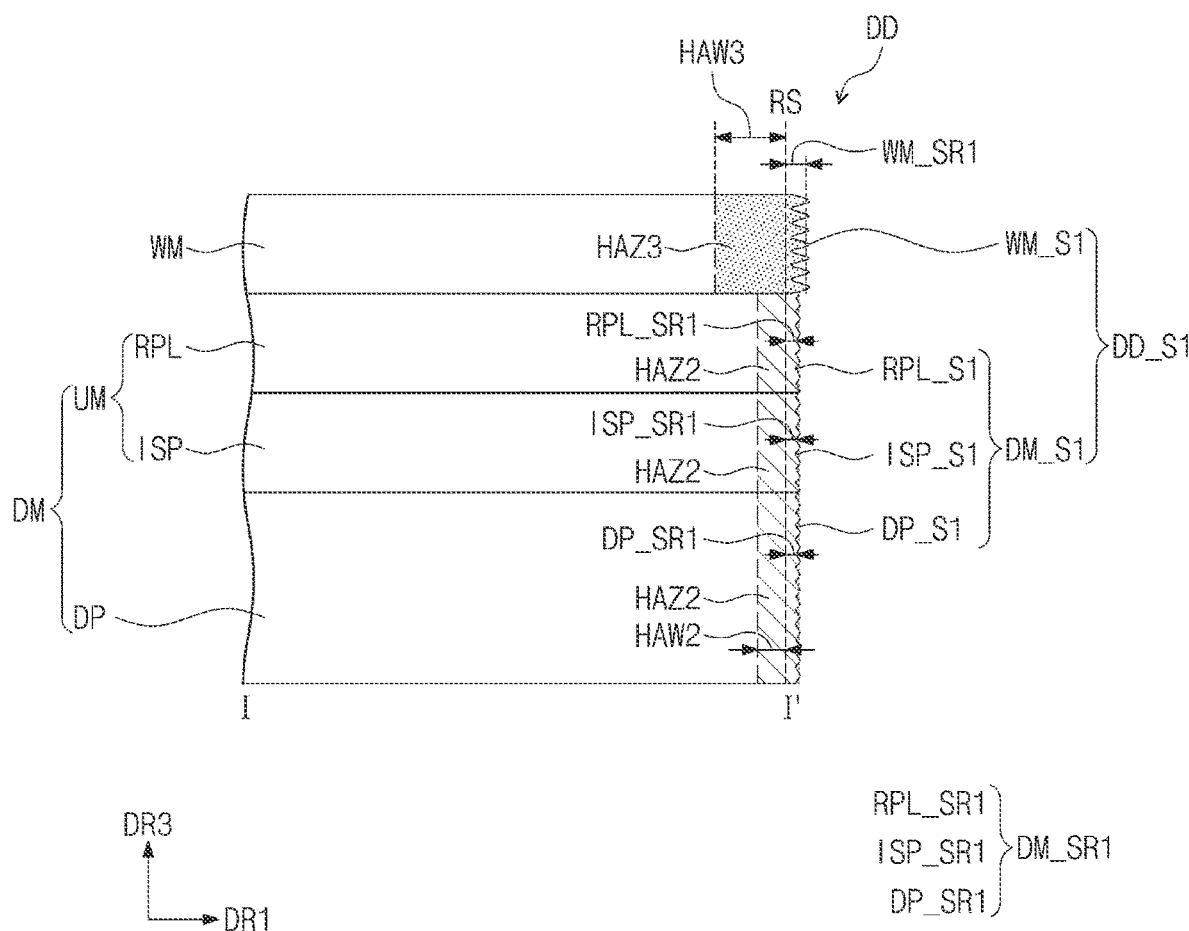
FIG. 5A is a cross-sectional view of a folding region taken along the line I-I' illustrated in FIG. 4B.
Figure 5B:
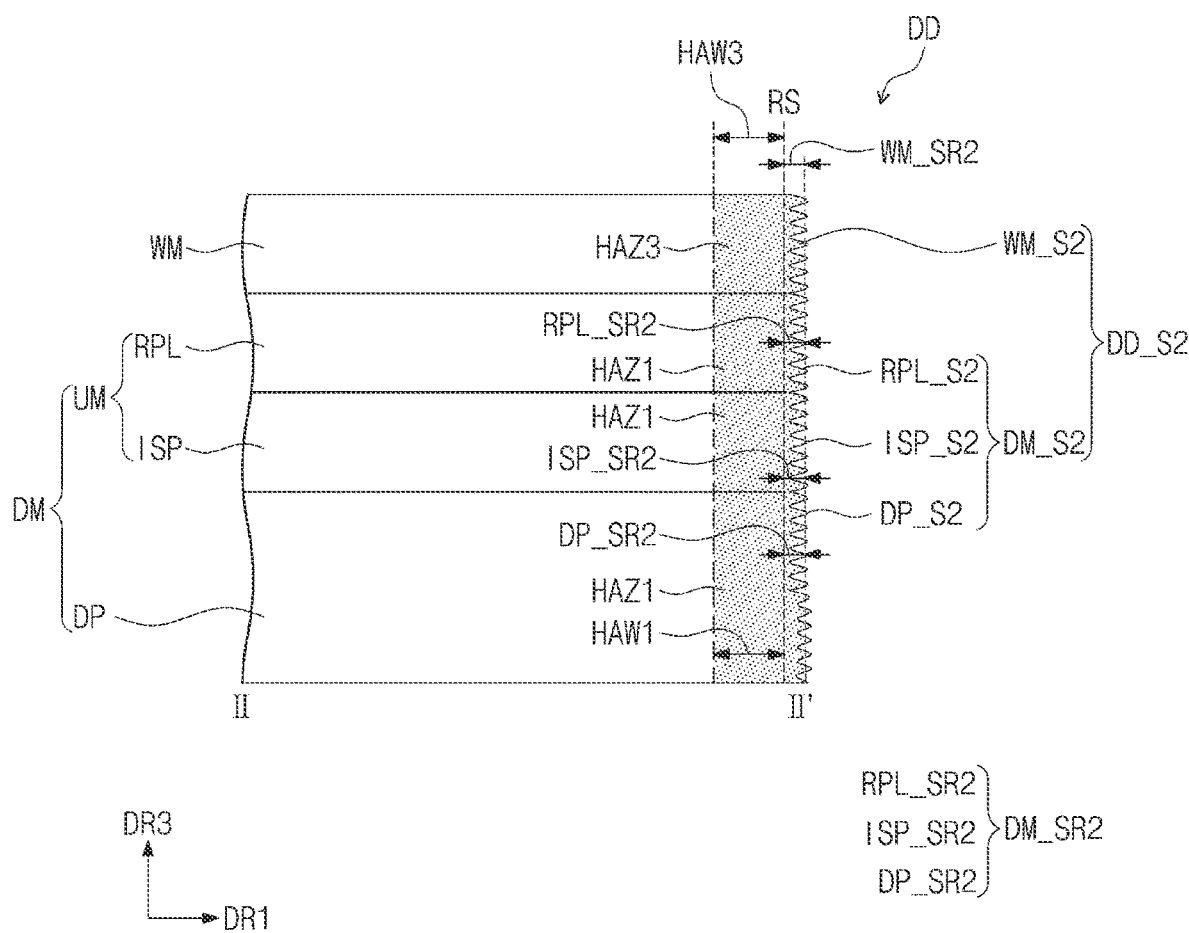
FIG. 5B is a cross-sectional view of a non-folding region taken along the line II-II' illustrated in FIG. 4B.

FIG. 5A is a cross-sectional view of a folding region taken along the line I-I' illustrated in FIG. 4B. FIG. 5B is a cross-sectional view of a non-folding region taken along the line II-II' illustrated in FIG. 4B.

Referring to FIGS. 4B to 5B, a side surface overlapping the folding region FA among the side surfaces DD_S of the display device DD is referred to as a first device side surface DD_S1. The first device side surface DD_S1 includes the first module side surface DM_S1 and the first window side surface WM_S1. A side surface overlapping the non-folding region NFA among the side surfaces DD_S of the display device DD is referred to as a second device side surface DD_S2. The second device side surface DD_S2 includes the second module side surface DM_S2 and the second window side surface WM_S2.

Among the side surfaces of the display panel DP, a side surface overlapping the folding region FA is referred to as a first panel side surface DP_S1 and a side surface overlapping the non-folding region NFA is referred to as a second panel side surface DP_S2. Among the side surfaces of the input sensor layer ISP, a side surface overlapping the folding region FA is referred to as a first sensor side surface ISP_S1 and a side surface overlapping the non-folding region NFA is referred to as a second sensor side surface ISP_S2. Among the side surfaces of the anti-reflection layer RPL, a side surface overlapping the folding region FA is referred to as a first anti-reflection side surface RPL_S1 and a side surface overlapping the non-folding region NFA is referred to as a second anti-reflection side surface RPL_S2.

According to some embodiments of the inventive concept, the first module side surface DM_S1 includes the first panel side surface DP_S1, the first sensor side surface ISP_S1, and the first anti-reflection side surface RPL_S1. In addition, the second module side surface DM_S2 includes the second panel side surface DP_S2, the second sensor side surface ISP_S2, and the second anti-reflection side surface RPL_S2.

However, when an adhesive layer is interposed between the display panel DP and the input sensor layer ISP, or an adhesive layer is interposed between the input sensor layer ISP and the anti-reflection layer RPL, the first and second module side surfaces DM_S1 and DM_S2 may further include a side surface of the adhesive layer.

When a degree of irregularity of a pattern formed on a processed surface is called surface roughness, the first window side surface WM_S1 has a first window surface roughness WM_SR1, and the second window side surface WM_S2 has a second window surface roughness WM_SR2.

The first window surface roughness WM_SR1 may be defined as an average value of heights from the reference surface RS to the first window side surface WM_S1 in the folding region FA. The second window surface roughness WM_SR2 may be defined as an average value of heights from the reference surface RS to the second window side surface WM_S2 in the non-folding region NFA. According to some embodiments of the inventive concept, the first window surface roughness WM_SR1 and the second window surface roughness WM_SR2 may be the same as each other.

The first module side surface DM_S1 has a first module surface roughness DM_SR1, and the second module side surface DM_S2 has a second module surface roughness DM_SR2. The first module surface roughness DM_SR1 may be defined as an average value of heights from the reference surface RS to the first module side surface DM_S1 in the folding region FA. The second module surface roughness DM_SR2 may be defined as an average value of heights from the reference surface RS to the second module side surface DM_S2 in the non-folding region NFA. According to some embodiments of the inventive concept, the first module surface roughness DM_SR1 may be lower than the second module surface roughness DM_SR2.

The first module surface roughness DM_SR1 may be an average value of a first panel surface roughness DP_SR1, which is the surface roughness DP_SR1 of the first panel side surface DP_S1, a first sensor surface roughness ISP_SR1, which is the surface roughness ISP_SR1 of the first sensor side surface ISP_S1, and a first anti-reflection surface roughness RPL_SR1, which is the surface roughness RPL_SR1 of the first anti-reflection side surface RPL_S1.

The second module surface roughness DM_SR2 may be an average value of a second panel surface roughness DP_SR2, which is the surface roughness DP_SR2 of the second panel side surface DP_S2, a second sensor surface roughness ISP_SR2, which is the surface roughness ISP_SR2 of the second sensor side surface ISP_S2, and a second anti-reflection surface roughness RPL_SR2, which is the surface roughness RPL_SR2 of the second anti-reflection side surface RPL_S2.

According to some embodiments of the inventive concept, the first panel surface roughness DP_SR1 may be lower than the second panel surface roughness DP_SR2.

The first sensor surface roughness ISP_SR1 may be lower than the second sensor surface roughness ISP_SR2.

The first anti-reflection surface roughness RPL_SR1 may be lower than the second anti-reflection surface roughness RPL_SR2.

Figure 7A:
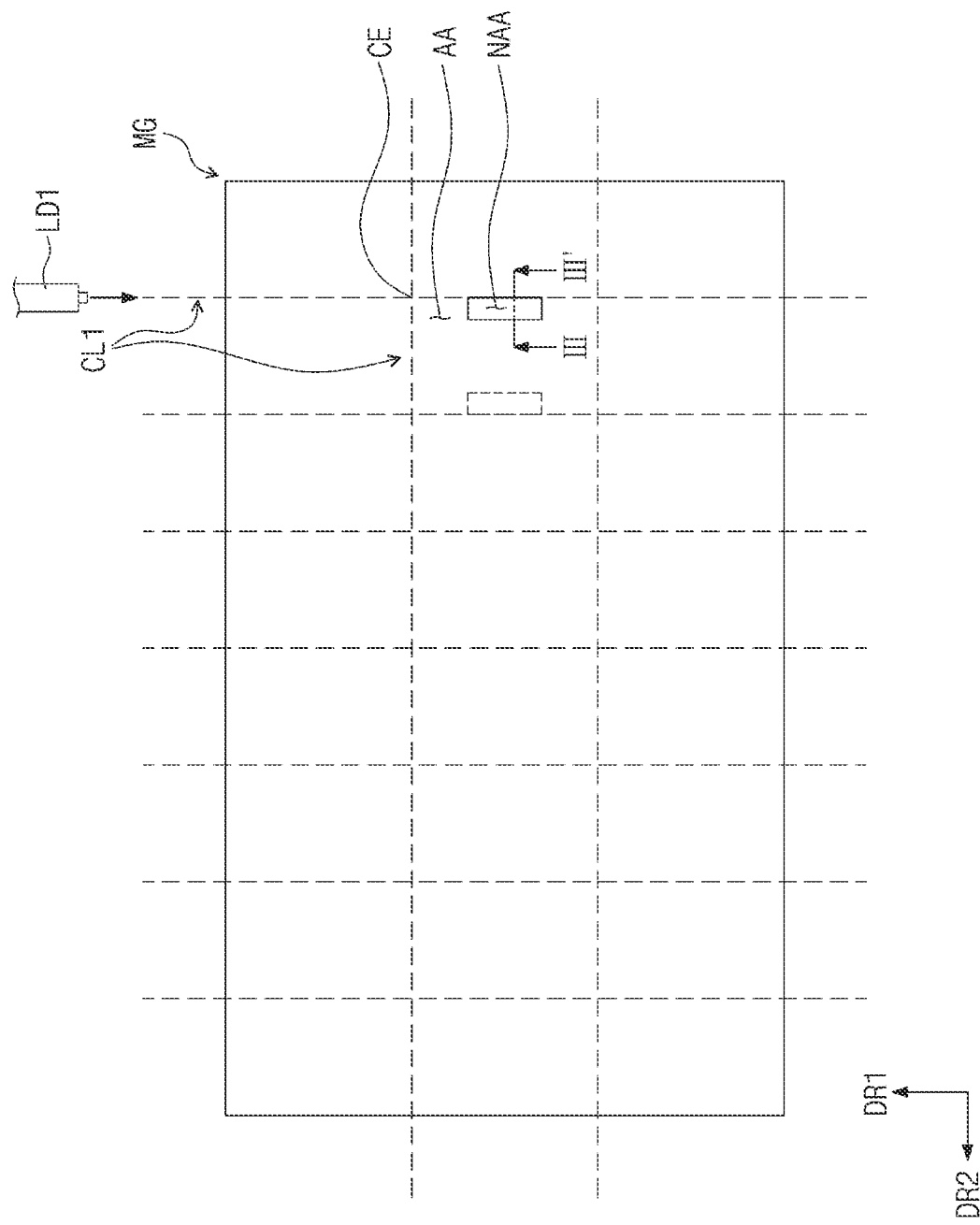
FIGS. 7A to 7C are process diagrams showing a first cutting process according to some embodiments of the inventive concept.

The second module side surface DM_S2 overlapping the non-folding region NFA is processed and formed by a first cutting process performed along a first cutting line CL1 (see FIG. 7A). The first module side surface DM_S1 overlapping the folding region FA is processed and formed by a second cutting process performed along a second cutting line CL2 (see FIG. 8A).

A region in which a surface processed by the cutting process is damaged during the cutting process is called a heat-affected zone HAZ. The wider the heat-affected zone HAZ is formed, the greater the damage to the processed surface may be and the higher the surface roughness of the processed surface may be.

According to some embodiments of the inventive concept, a heat-affected zone created by the first cutting process may be referred to as a first heat-affected zone HAZ1, and a heat-affected zone created by the second cutting process may be referred to as a second heat-affected zone HAZ2. When a width of the first heat-affected zone HAZ1 in the first direction DR1 is referred to as a first heat-affected width HAW1, and a width of the second heat-affected zone HAZ2 in the first direction DR1 is referred to as a second heat-affected width HAW2, the first heat-affected width HAW1 may be greater than the second heat-affected width HAW2. Therefore, the first module surface roughness DM_SR1 of the first module side surface DM_S1 processed by the second cutting process may be lower than the second module surface roughness DM_SR2 of the second module side surface DM_S2 processed by the first cutting process.

Unlike this, the first window side surface WM_S1 and the second window side surface WM_S2 may be formed by the same cutting process. Accordingly, the width HAW3 of the heat-affected zone HAZ3 formed on the first window side surface WM_S1 in the first direction DR1 may be the same as the width HAW3 of the heat-affected zone HAZ3 formed on the second window side surface WM_S2 in the first direction DR1. Therefore, the first window side surface WM_S1 may have the same surface roughness as that of the second window side surface WM_S2.

Figure 6:
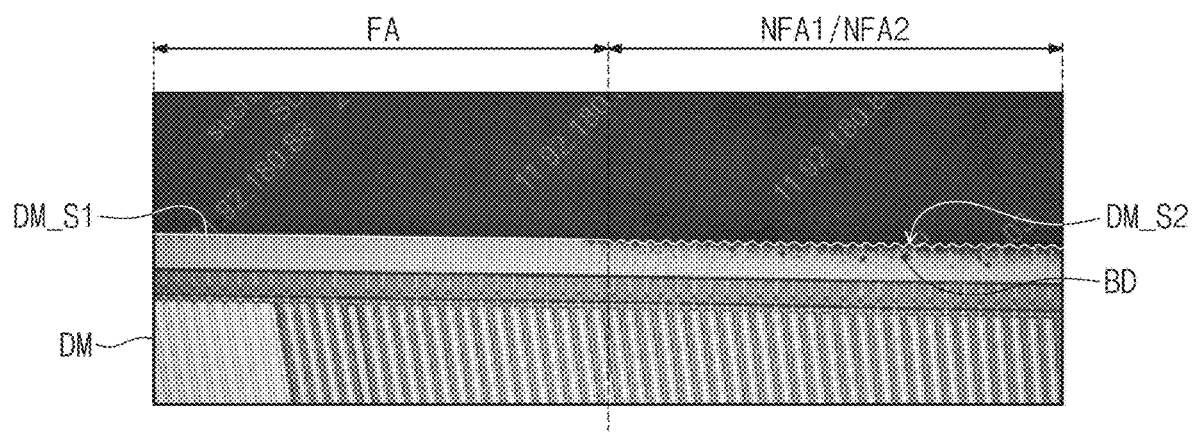
FIG. 6 is a photograph of a side surface of a display module positioned in a folding region and a non-folding region.

FIG. 6 is a photograph of a side surface of a display module positioned in a folding region and a non-folding region.

Referring to FIG. 6, the side surface DM_S1 of the display module DM positioned in the folding region FA has a surface roughness lower than that of the side surface DM_S2 of the display module DM positioned in the first and second non-folding regions NFA1 and NFA2. That is, relatively small and regular bumps are formed on the first module side surface DM_S1, while relatively large and irregular bumps are formed on the second module side surface DM_S2.

Small and large black dots BD are visually recognized on the second module side surface DM_S2. Here, the black dots BD may be portions in which the second module side surface DM_S2 is recessed, and relatively bright portions around the black dots BD may be protruding portions of the second module side surface DM_S2. According to some embodiments of the inventive concept, the black dots BD may be located on the anti-reflection layer RPL (see FIG. 5B), but the embodiments of the inventive concept are not limited thereto. The black dots BD may be located on the display panel DP (see FIG. 5B) or on the input sensor layer ISP (see FIG. 5B) as well as on the anti-reflection layer RPL.

On the other hand, the difference in light and shade according to location on the first module side surface DM_S1 is not large, and black dots are hardly recognized. Therefore, it can be seen that the first module side surface DM_S1 has a surface roughness lower than that of the second module side surface DM_S2.

Figure 7B:
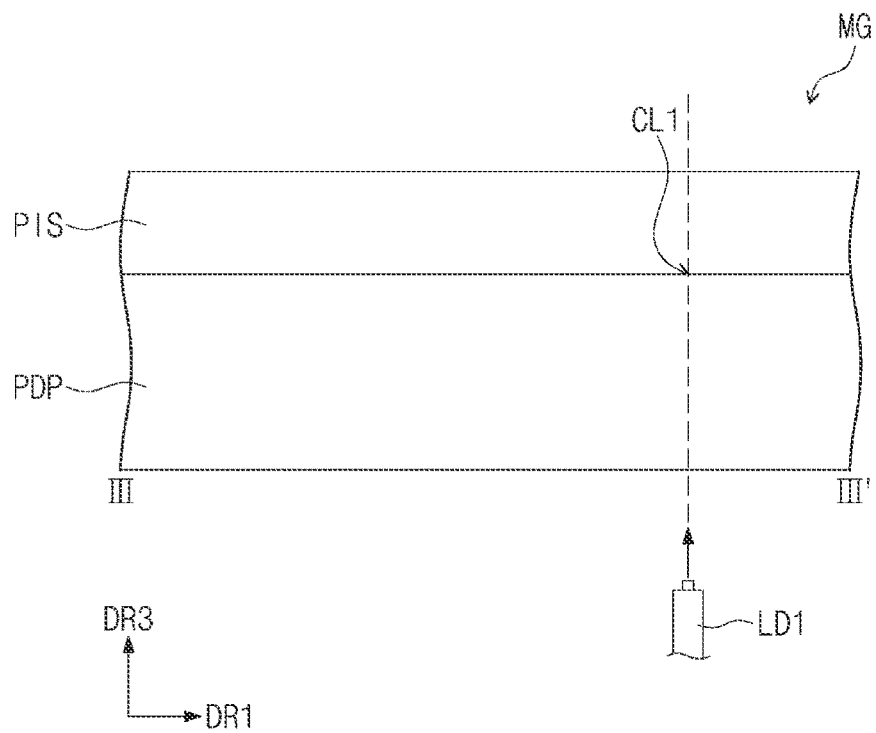
Figure 7C:
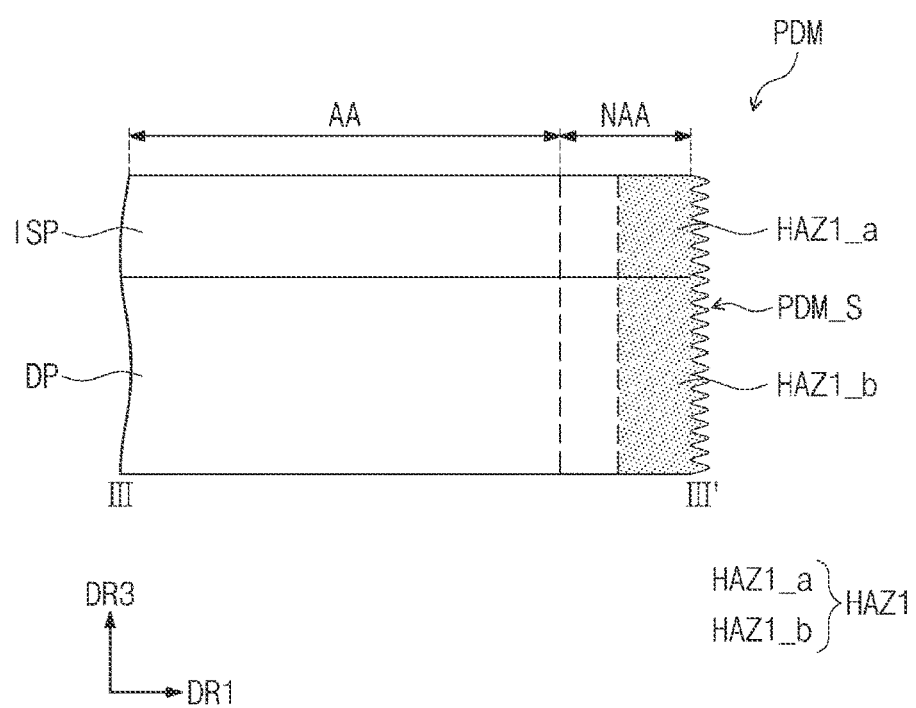
Figure 8A:
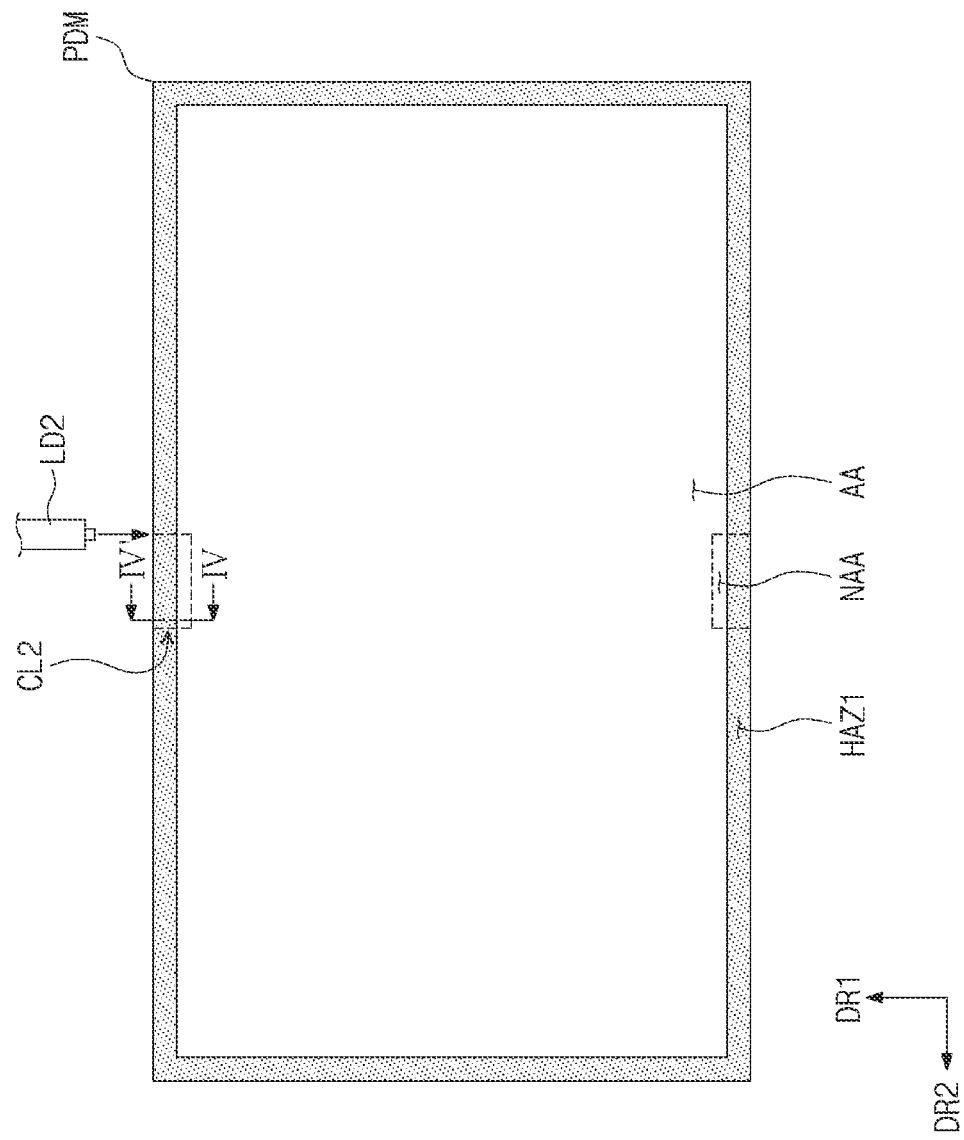
FIGS. 8A to 8C are process diagrams showing a second cutting process according to some embodiments of the inventive concept.
Figure 8B:
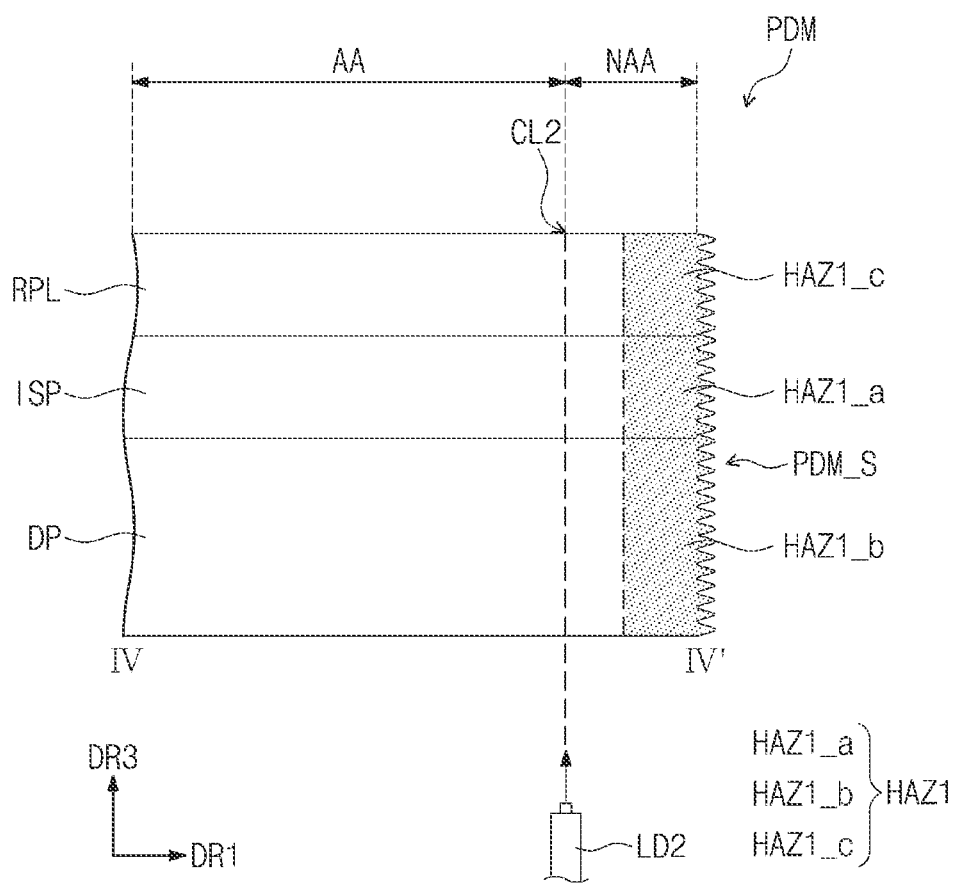
Figure 8C:
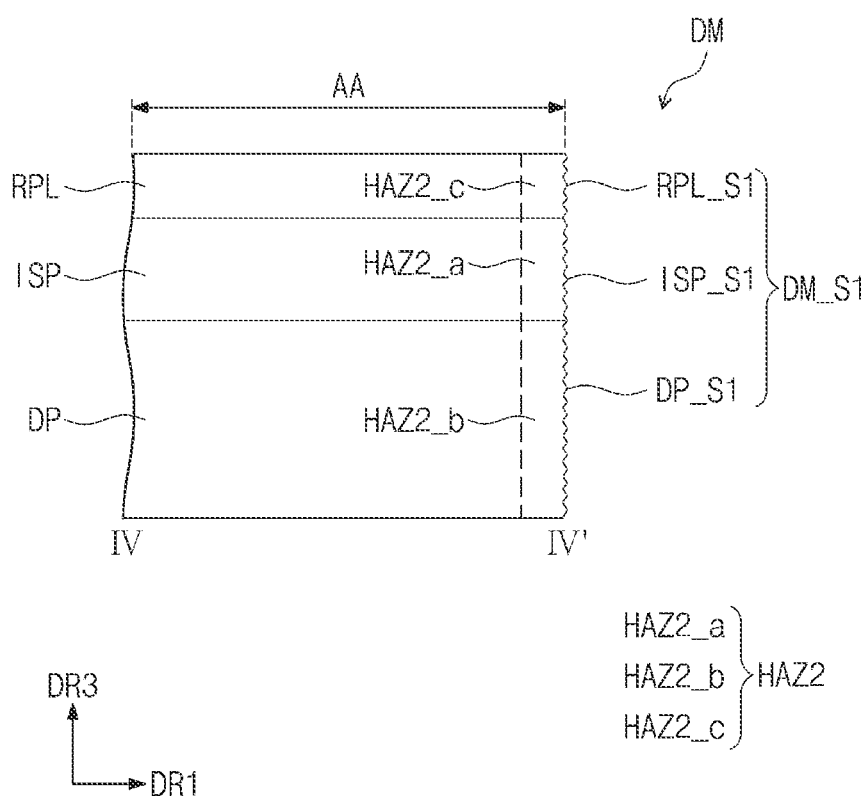

FIGS. 7A to 7C are process diagrams showing a first cutting process according to some embodiments of the inventive concept, and FIGS. 8A to 8C are process diagrams showing a second cutting process according to some embodiments of the inventive concept.

Referring to FIGS. 7A to 8C, a mother substrate MG including a plurality of cell regions CE is prepared. Each of the cell regions CE includes an effective region AA and a non-effective region NAA.

Each preliminary display module PDM is obtained from the mother substrate MG by performing the first cutting process along the first cutting line CL1 surrounding each of the cell regions CE.

The first cutting process may be performed by using a first laser LD1 having a first wavelength. According to some embodiments of the inventive concept, the first laser LD1 may be generated by using carbon dioxide as a medium, and the first wavelength may be about 1000 nm to about 1400 nm. The first cutting process may be performed by irradiating the first laser LD1 n times repeatedly, where n is a natural number. The first laser LD1 may be irradiated at a first frequency and may be irradiated with a first power.

According to some embodiments of the inventive concept, the first cutting process may be performed by moving the mother substrate MG while the position of the first laser LD1 is fixed.

Referring to FIG. 8A, each preliminary display module PDM obtained by the first cutting process is prepared. The non-effective region NAA may be removed from the effective region AA by performing the second cutting process along the second cutting line CL2 located at the boundary between the effective region AA and the non-effective region NAA included in each preliminary display module PDM.

The second cutting process may be performed by using a second laser LD2 having a second wavelength different from the first wavelength. According to some embodiments of the inventive concept, the second wavelength may be smaller than the first wavelength. The second wavelength may be about 300 nm to about 400 nm. The second cutting process may be performed by irradiating the second laser LD2 m times repeatedly. According to some embodiments of the inventive concept, m may be a natural number greater than n.

The second laser LD2 may be irradiated at a second frequency. According to some embodiments of the inventive concept, the second frequency may be greater than the first frequency. The second laser LD2 may be irradiated with a second power. According to some embodiments of the inventive concept, the second power may be smaller than the first power.

According to some embodiments of the inventive concept, the second cutting process may be performed by moving the second laser LD2 while the position of each preliminary display module PDM is fixed. According to some embodiments of the present invention, it is enough as long as the second laser LD2 is capable of performing the second cutting process along the second cutting line CL2. That is, although the size of the preliminary display module PDM increases, the length of the second cutting line is limited to the boundary between the non-effective region NAA and the effective region AA. Therefore, even though the size of the preliminary display module PDM is changed, there is no need to replace a device to perform the second cutting process. In addition, because the second cutting process is performed only at the portion at which the effective region AA and the non-effective region NAA are in contact with each other, the process time may be shortened.

Referring to FIGS. 7B and 7C, the mother substrate MG may include a preliminary display panel PDP and a preliminary input sensor layer PIS. However, according to some embodiments of the inventive concept, the mother substrate MG may not include the preliminary input sensor layer PIS.

A first heat-affected zone HAZ1 is formed adjacent to the side surface PDM_S of the preliminary display module PDM obtained by performing the first cutting process using the first laser LD1 along the first cutting line CL1. The first heat-affected zone HAZ1 includes a first sub heat-affected zone HAZ1_a formed adjacent to the side surface of the input sensor layer ISP and a second sub heat-affected zone HAZ1_b formed adjacent to the side surface of the display panel DP. The first sub heat-affected zone HAZ1_a and the second sub heat-affected zone HAZ1_b may have the same width in the first direction DR1. However, the widths of the first sub heat-affected zone HAZ1_a and the second sub heat-affected zone HAZ1_b in the first direction DR1 may vary according to materials contained in the input sensor layer ISP and the display panel DP.

According to some embodiments of the inventive concept, a width NAW (see FIG. 9A) of the non-effective region NAA in the first direction DR1 may be greater than or equal to the first heat-affected width HAW1 (see FIG. 9A) of the first heat-affected zone HAZ1 in the first direction DR1.

Referring to FIGS. 8B and 8C, each preliminary display module PDM (see FIG. 7C) may further include an anti-reflection layer RPL. The anti-reflection layer RPL may be arranged on the input sensor layer ISP. Although FIG. 8B illustrates that the width in the first direction DR1 of the third sub heat-affected zone HAZ1_c generated on the side surface of the anti-reflection layer RPL is the same as the width in the first direction DR1 of the first and second sub heat-affected zones HAZ1_a and HAZ1_b, the width in the first direction DR1 of the third sub heat-affected zone HAZ1_c may be different from the width in the first direction DR1 of the first and second sub heat-affected zones HAZ1_a and HAZ1_b.

The display module DM in which the non-effective region NAA is removed from the effective region AA of the preliminary display module PDM may be obtained by performing the second cutting process using the second laser LD2 along the second cutting line CL2.

A second heat-affected zone HAZ2 is formed on the side surface DM_S2 of the display module DM obtained by performing the second cutting process. The second heat-affected zone HAZ2 includes a fourth sub heat-affected zone HAZ2_a formed adjacent to the side surface of the input sensor layer ISP, a fifth sub heat-affected zone HAZ2_b formed adjacent to the side surface of the display panel DP, and a sixth sub heat-affected zone HAZ2_c formed adjacent to the side surface of the anti-reflection layer RPL. The widths in the first direction DR1 of the fourth sub heat-affected zone HAZ2_a, the fifth sub heat-affected zone HAZ2_b, and the sixth sub heat-affected zone HAZ2_c may be the same as each other. However, depending on materials contained in the input sensor layer ISP, the display panel DP, and the anti-reflection layer RPL, the widths in the first direction DR1 of the fourth sub heat-affected zone HAZ2_a, the fifth sub heat-affected zone HAZ2_b, and the sixth sub heat-affected zone HAZ2_c may be different from each other.

Because the second cutting process is performed by the second laser LD2 having the second power that is relatively small compared to the first power of the first laser LD1, the second heat-affected width HAW2 (see FIG. 5A) may be formed smaller than the first heat-affected width HAW1 (see FIG. 5B).

Therefore, when the second cutting process is performed along the second cutting line CL2 after the first cutting process is performed to obtain a preliminary display module including an effective region AA and a non-effective region NAA preset to include a region extending from an arbitrary region of the display module DM, the display module DM in which the second heat-affected zone HAZ2 is generated may be obtained in the effective region AA that comes in contact with the non-effective region NAA.

According to some embodiments of the inventive concept, the non-effective region NAA may include at least a region extending from the folding region FA (see FIG. 9B) of the display module DM. However, the embodiments of the inventive concept are not limited thereto, and the non-effective region NAA may include a region extending from a portion of the non-folding region NFA (see FIG. 9B).

When the non-effective region NAA includes a region extending from the folding region FA, the first heat-affected zone HAZ1 is formed in the non-folding region NFA in which only the first cutting process is performed, and the second heat-affected zone HAZ2 is formed in the folding region FA in which the first cutting process and the second cutting process are performed. Accordingly, the surface roughness DM_SR1 of the first module side surface DM_S1 (see FIG. 4B) may be lower than the surface roughness DM_SR2 of the second module side surface DM_S2 (see FIG. 4B).

Therefore, it may be possible to prevent or reduce instances of the display module DM being damaged due to a crack or the like, which may be caused by stress applied to the first module side surface DM_S1 because of repeated folding operation. As a result, product reliability of the display device DD may be improved.

FIGS. 9A to 12B are plane views illustrating the second cutting process according to some embodiments of the inventive concept.

Figure 9B:
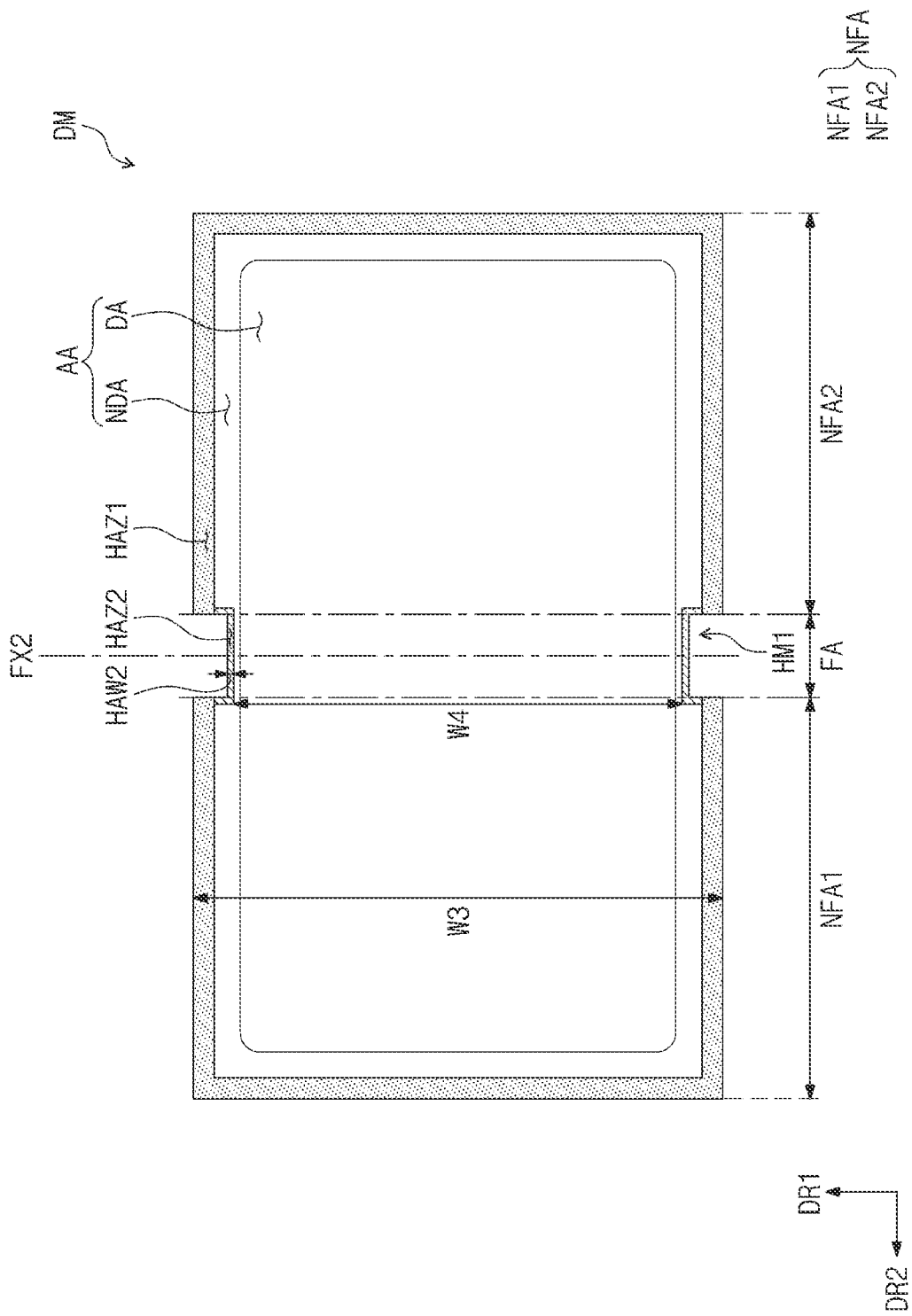
FIGS. 9A to 12B are plane views illustrating the second cutting process according to some embodiments of the inventive concept.

Referring to FIGS. 9A and 9B, the non-effective region NAA may have a rectangular shape. The second cutting line CL2 is located at the boundary between the non-effective region NAA and the effective region AA.

The effective region AA includes a display region DA and a non-display region NDA. The display module DM may include a first recessed portion HM1. The first recessed portion HM1 may be formed by removing the non-effective region NAA from the effective region AA by the second cutting process. The first recessed portion HM1 may have a rectangular shape corresponding to the non-effective region NAA having a rectangular shape.

According to some embodiments of the inventive concept, when the non-effective region NAA includes a region extending from the folding region FA, the first recessed portion HM1 may be located in a region extending from the folding region FA.

The display module DM has, in the reference direction, a third width W3 in the non-folding region NFA and a fourth width W4 in the folding region FA. According to some embodiments of the inventive concept, when the display module DM includes the first recessed portion HM1, the fourth width W4 may be smaller than the third width W3.

Figure 10B:
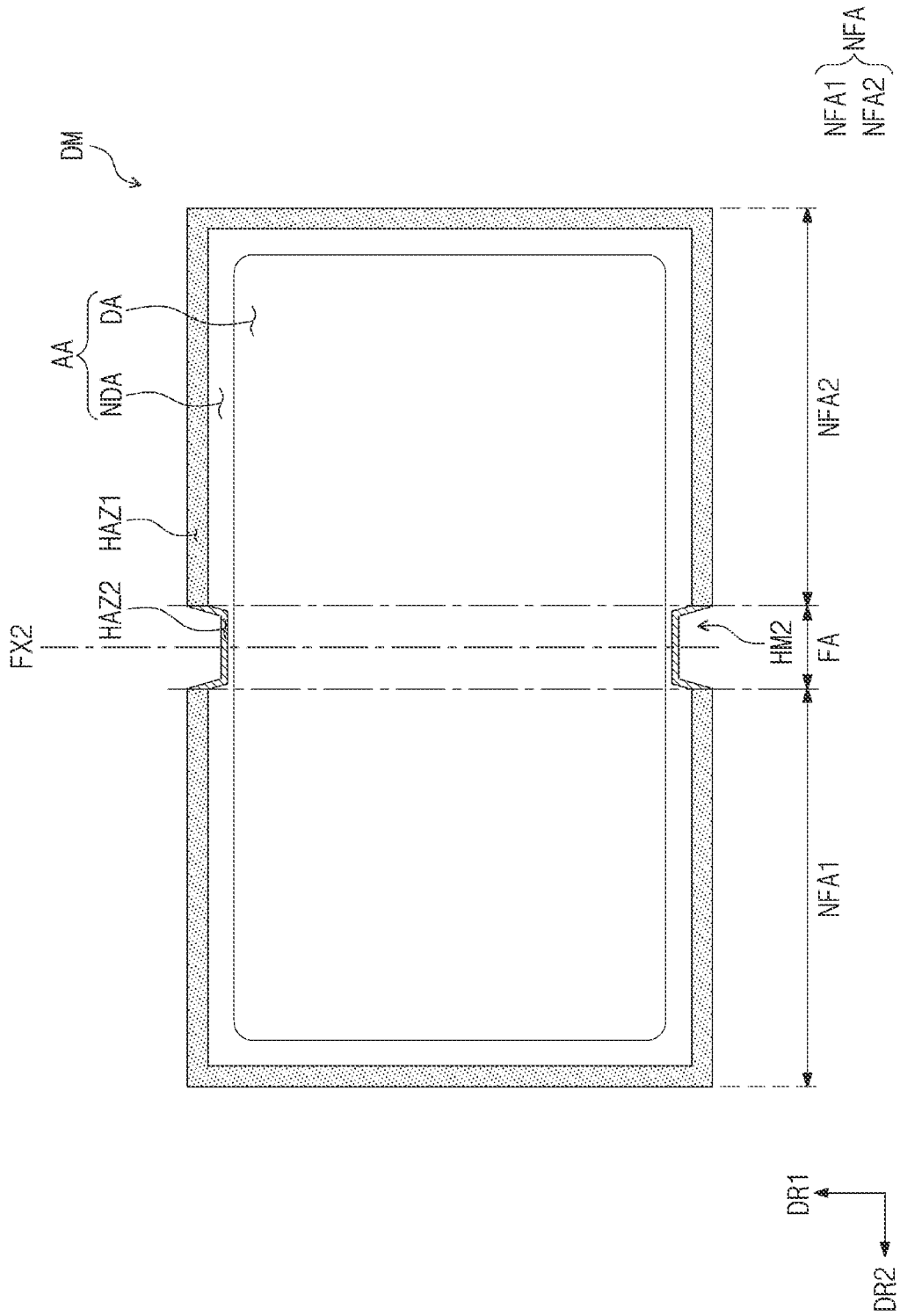

Referring to FIGS. 10A and 10B, the non-effective region NAA may have a polygonal shape. According to some embodiments of the inventive concept, the non-effective region NAA may have a trapezoidal shape.

The display module DM may include a second recessed portion HM2. The second recessed portion HM2 may have a trapezoidal shape corresponding to the non-effective region NAA having a trapezoidal shape.

According to some embodiments of the inventive concept, when the non-effective region NAA includes a region extending from the folding region FA, the second recessed portion HM2 may be located in a region extending from the folding region FA.

Figure 11B:
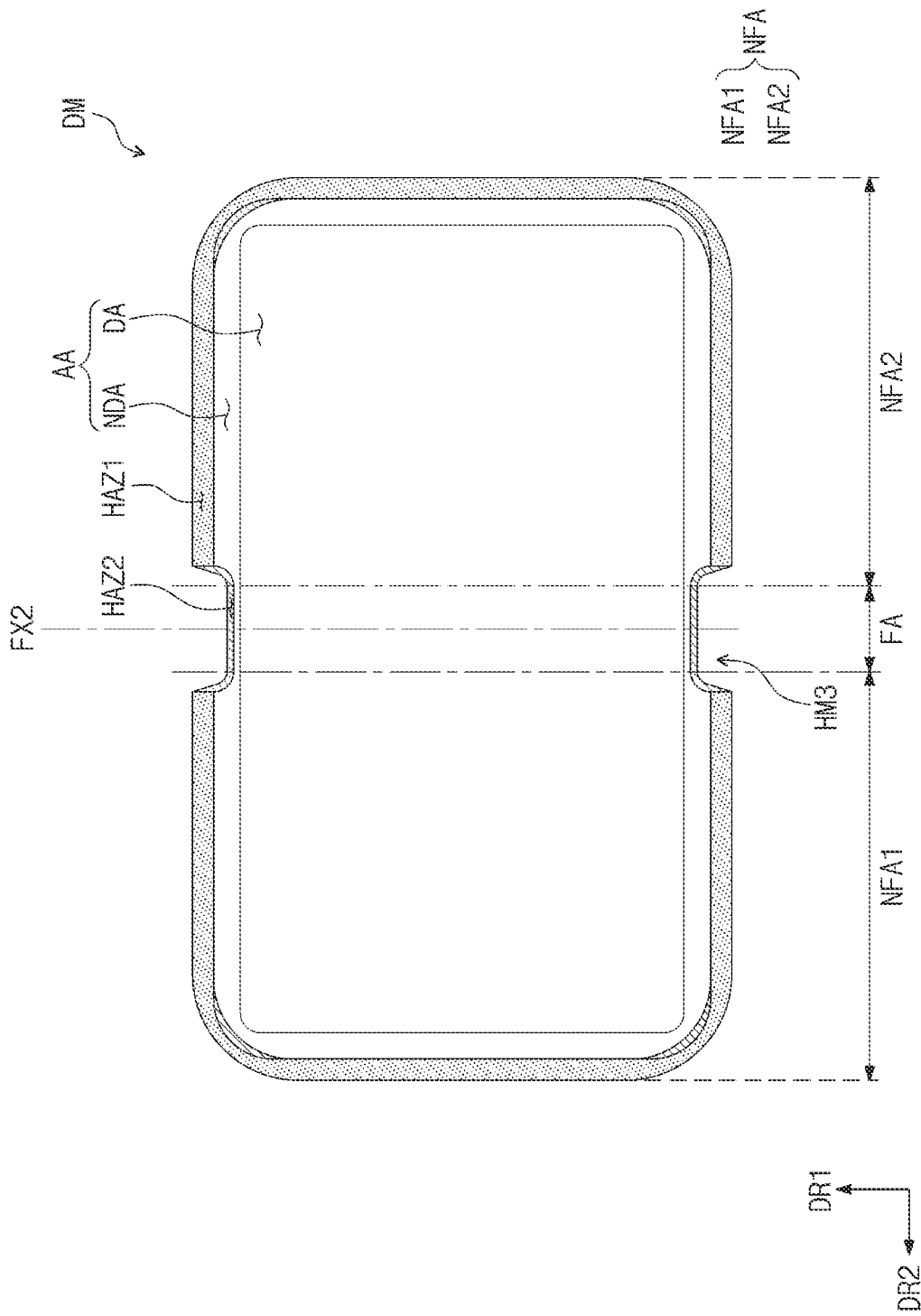

Referring to FIGS. 11A and 11B, the non-effective region NAA includes: a first non-effective region NAA_a extending from the folding region FA; and a second non-effective region NAA_b extending from a corner portion that is a portion of the non-folding region NFA. At least one of the first and second non-effective regions NAA_a and NAA_b may have a curved shape.

The second cutting line CL2 includes a first sub-cutting line CL2_a located at the boundary between the effective region AA and the first non-effective region NAA_a, and a second sub-cutting line CL2_b located at the boundary between the effective region AA and the second non-effective region NAA_b.

The display module DM may include a third recessed portion HM3. The third recessed portion HM3 may be formed by removing the first non-effective region NAA_a from the effective region AA by the second cutting process. The third recessed portion HM3 may have a curved shape corresponding to the first non-effective region NAA_a having a curved shape.

According to some embodiments of the inventive concept, the display module DM may have a curved shape at a corner portion. The curved shape may be formed by removing the second non-effective region NAA_b from the effective region AA by the second cutting process. When the non-effective region NAA is set to include the second non-effective region NAA_b as well as the first non-effective region NAA_a, the second cutting process may make it possible to obtain a desired shape of the display module DM in addition to preventing or reducing instances of the display module DM being damaged during folding operation.

Figure 12A:
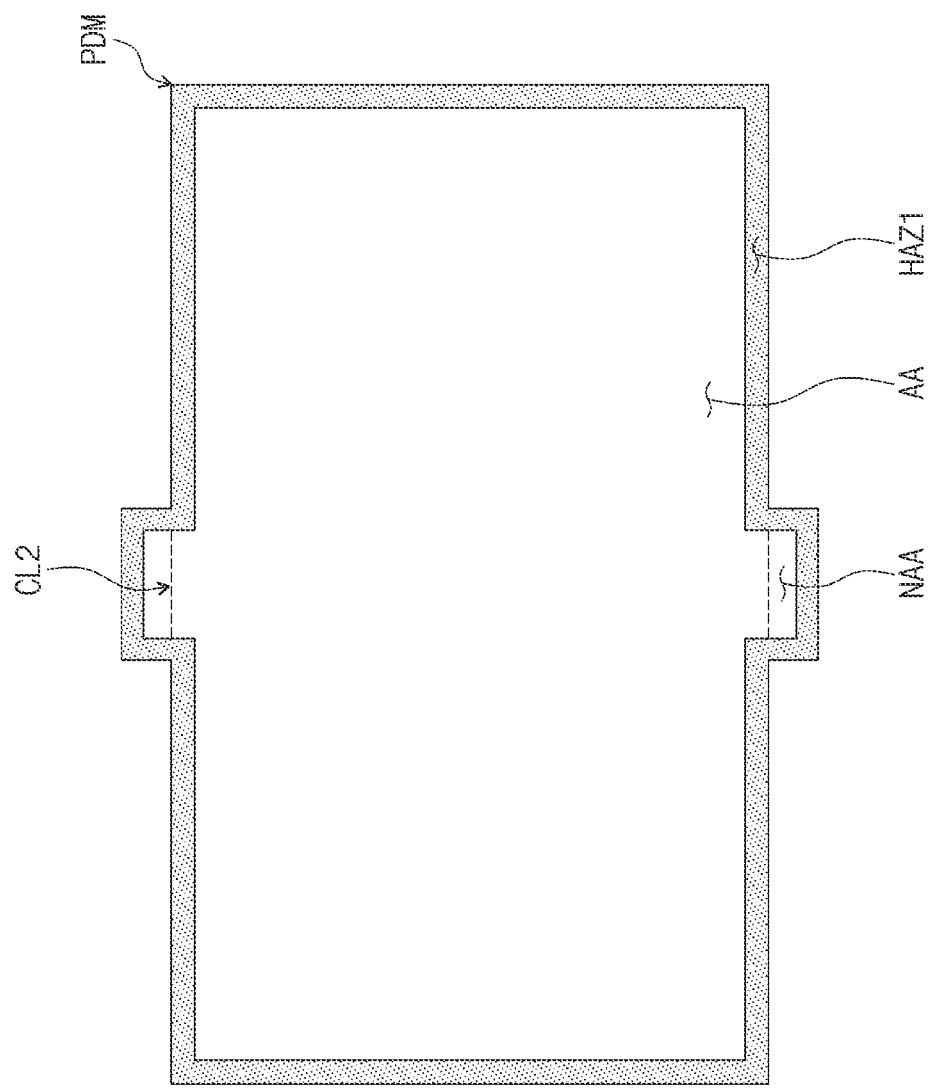
Figure 12B:
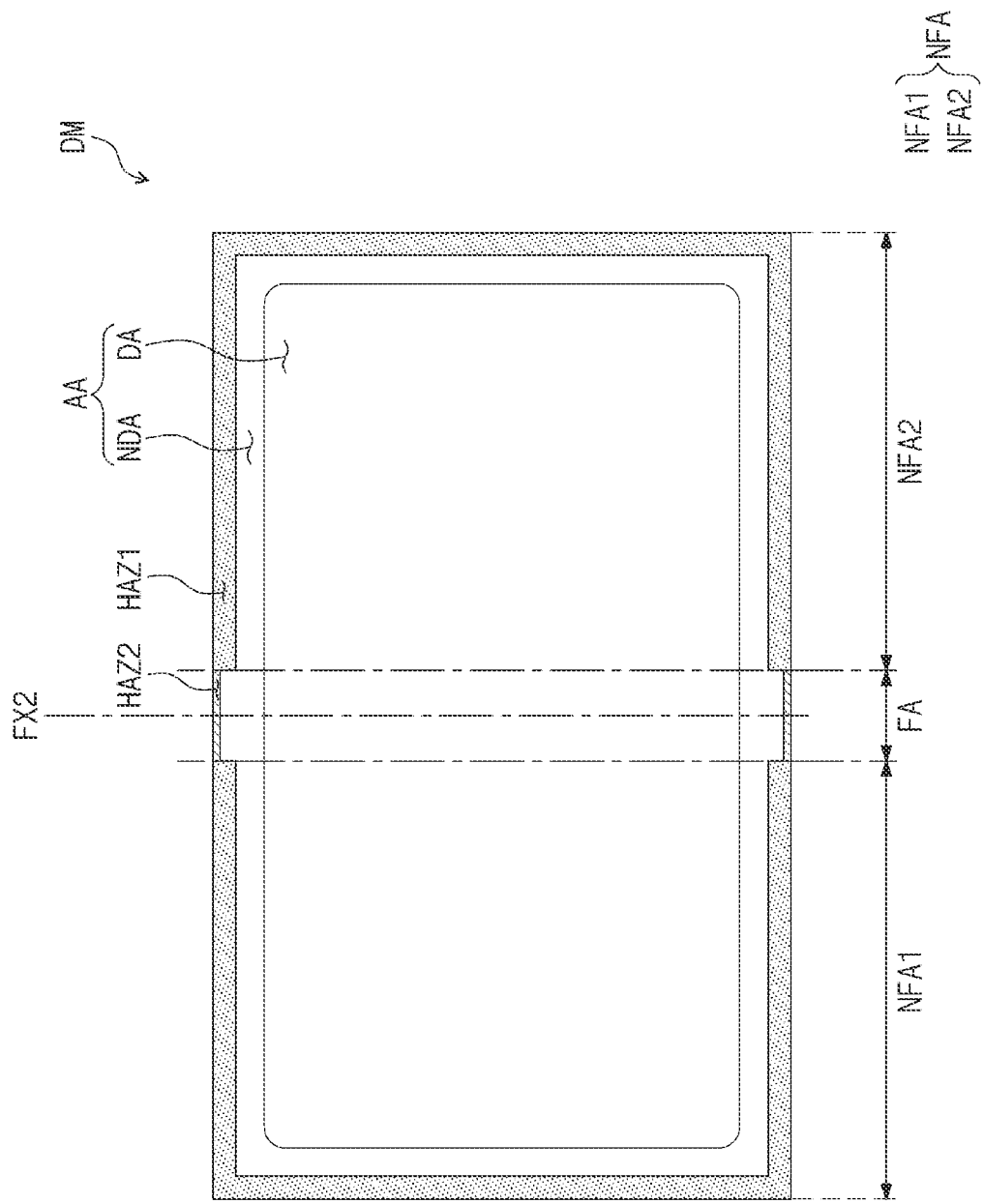

Referring to FIGS. 12A and 12B, the non-effective region NAA may extend from the folding region FA and may have a shape protruding from the effective region AA. According to some embodiments of the inventive concept, the non-effective region NAA may have a curved shape and protrude.

When the non-effective region NAA has a shape protruding from the effective region AA, the display module DM may not include a recessed portion. The display module DM from which the non-effective region NAA is removed by the second cutting process may have a rectangular shape. However, even in this case, the first module side surface DM_S1 overlapping the folding region FA among the side surfaces DM_S (see FIG. 4B) of the display module DM may have a relatively low surface roughness when compared to the second module side surface DM_S2 overlapping the non-folding region NFA. Therefore, it may be possible to improve product reliability by preventing or reducing damage to the display module DM during a folding operation.

According to some embodiments of the present invention, in order to reduce stress and damage applied to the side surface of the display panel, a cutting process using a low-energy laser may be performed along a cutting line located at least in the folding region. Therefore, even though the size of the display panel increases, a cutting process using a low-energy laser may be performed in the folding region without moving a laser device. Accordingly, it may be possible to improve folding reliability of the display device by reducing defects such as cracks in the folding region during folding operation of the display device.

Although aspects of embodiments according to the present invention have been described with reference to some example embodiments thereof, those skilled in the art or those of ordinary skill in the art will understand that various modifications and changes can be made to the present invention within the scope that does not depart from the spirit and technical field of the present invention described in the claims and their equivalents.

Accordingly, the technical scope of embodiments according to the present invention should not be limited to the content described in the detailed description of the specification, but should be determined by the claims and their equivalents.

What is claimed is:

1. A display device comprising:
 a display panel comprising a folding region configured to be folded around a folding axis and a non-folding region adjacent to the folding region; and
 a window on the display panel and configured to be folded with the display panel,
 wherein:
 a side surface of the display panel has a first surface roughness in the folding region and a second surface roughness in the non-folding region;
 the first surface roughness is less than the second surface roughness; and
 a side surface of the window has a same surface roughness in the non-folding region and the folding region.

2. The display device of claim 1, wherein the window comprises a thin-film glass.

3. The display device of claim 1, further comprising an anti-reflection layer on the display panel and foldable along the display panel.

4. The display device of claim 3, wherein:
a side surface of the anti-reflection layer has a third surface roughness in the folding region and a fourth surface roughness in the non-folding region; and
the third surface roughness is less than the fourth surface roughness.

5. The display device of claim 1, wherein:
the display panel comprises a recessed portion in the folding region;
when a direction of the folding axis is referred to as a reference direction, the display panel has, in the reference direction, a first width in the non-folding region and a second width in the folding region; and
the second width is smaller than the first width.

6. The display device of claim 5, wherein the recessed portion comprises a curved shape.

7. The display device of claim 5, wherein the window has a same width in the folding region and the non-folding region in the reference direction.

8. The display device of claim 7, wherein:
the window comprises a transmission region through which light passes and a bezel region adjacent to the transmission region; and
the recessed portion is spaced apart from the transmission region.

9. A display device comprising:
a display panel comprising a folding region configured to be folded around a folding axis and a non-folding region adjacent to the folding region; and
a window on the display panel and configured to be folded with the display panel,
wherein:
a side surface of the display panel comprises a first side surface having a first surface roughness and a second side surface having a second surface roughness greater than the first surface roughness;
a side surface of the window has a same surface roughness in the non-folding region and the folding region; and
the first side surface comprises a side surface overlapping at least the folding region among the side surfaces of the display panel.

10. The display device of claim 9, wherein the window comprises a thin-film glass.

11. The display device of claim 9, wherein the first side surface has a curved shape.

12. The display device of claim 9, wherein the first side surface further comprises a portion overlapping the non-folding region among the side surfaces of the display panel.

13. The display device of claim 9, further comprising an anti-reflection layer on the display panel and foldable along the display panel,
wherein:
a side surface of the anti-reflection layer comprises a third side surface having a third surface roughness and a fourth side surface having a fourth surface roughness greater than the third surface roughness; and
the third side surface overlaps the first side surface.

* * * * *